United States Patent
Hashiguchi

(10) Patent No.: US 12,272,713 B2
(45) Date of Patent: Apr. 8, 2025

(54) SEMICONDUCTOR APPARATUS AND ELECTRONIC EQUIPMENT

(71) Applicant: SONY SEMICONDUCTOR SOLUTIONS CORPORATION, Kanagawa (JP)

(72) Inventor: Hideto Hashiguchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 337 days.

(21) Appl. No.: 17/295,135

(22) PCT Filed: Oct. 18, 2019

(86) PCT No.: PCT/JP2019/041079
§ 371 (c)(1),
(2) Date: May 19, 2021

(87) PCT Pub. No.: WO2020/116040
PCT Pub. Date: Jun. 11, 2020

(65) Prior Publication Data
US 2022/0005860 A1  Jan. 6, 2022

(30) Foreign Application Priority Data
Dec. 4, 2018  (JP) ................................. 2018-227349

(51) Int. Cl.
*H01L 27/146*  (2006.01)
(52) U.S. Cl.
CPC .. *H01L 27/14636* (2013.01); *H01L 27/14643* (2013.01)
(58) Field of Classification Search
CPC ......... H01L 27/14636; H01L 27/14634; H01L 27/1469; H01L 27/14643;
(Continued)

(56) References Cited

U.S. PATENT DOCUMENTS 10,504,852 B1\* 12/2019 Chen ................... H01L 25/0657
2006/0128148 A1  6/2006 Takahashi
(Continued)

FOREIGN PATENT DOCUMENTS

CN  101114612  1/2008
CN  101615608  12/2009
(Continued)

OTHER PUBLICATIONS

International Search Report prepared by the Japan Patent Office on Nov. 28, 2019, for International Application No. PCT/JP2019/041079.
(Continued)

*Primary Examiner* — Dale E Page
*Assistant Examiner* — Lawrence C Tynes, Jr.
(74) *Attorney, Agent, or Firm* — SHERIDAN ROSS P.C.

(57) ABSTRACT

A semiconductor apparatus and electronic equipment are provided that allow improvement of bondability between a first electrode section and a second electrode section. A semiconductor apparatus includes a first interconnect section, a first interlayer insulating film covering one surface side of the first interconnect section, a first electrode section in a first through-hole in the first interlayer insulating film and electrically connected to the first interconnect section, a second interconnect section, a second interlayer insulating film covering a surface side of the second interconnect section facing the first interconnect section, and a second electrode section in a second through-hole in the second interlayer insulating film and electrically connected to the second interconnect section. The first electrode section and the second electrode section are directly bonded to each other. The first electrode section has a larger coefficient of thermal expansion than that of the first interconnect section.

20 Claims, 25 Drawing Sheets

(58) Field of Classification Search
CPC . H01L 2224/05546; H01L 2224/05569; H01L 2224/08145; H01L 2224/48599; H01L 2224/05318; H01L 21/768; H01L 21/3205; H01L 23/522; H04N 25/70; H10K 85/371

See application file for complete search history.

(56) References Cited

U.S. PATENT DOCUMENTS

| | | | | |
|---|---|---|---|---|
| 2009/0194889 | A1* | 8/2009 | Jeng | H01L 24/03 257/786 |
| 2010/0259662 | A1* | 10/2010 | Oike | H04N 25/772 348/308 |
| 2011/0260184 | A1* | 10/2011 | Furuyama | H01L 33/38 257/E33.072 |
| 2012/0199930 | A1* | 8/2012 | Hayashi | H01L 27/14634 257/E31.127 |
| 2012/0211892 | A1* | 8/2012 | Kim | H01L 24/97 257/774 |
| 2012/0228771 | A1 | 9/2012 | Edelstein | |
| 2013/0112849 | A1 | 5/2013 | Shimotsusa | |
| 2014/0077057 | A1* | 3/2014 | Chao | H01L 27/14634 257/E31.084 |
| 2014/0131874 | A1* | 5/2014 | Kagawa | H01L 23/53209 257/758 |
| 2015/0205041 | A1* | 7/2015 | Neelakantan | H01L 24/03 438/27 |
| 2016/0284753 | A1* | 9/2016 | Komai | H01L 23/481 |
| 2016/0358859 | A1* | 12/2016 | Murray | H01L 23/53233 |
| 2017/0062366 | A1* | 3/2017 | Enquist | H01L 25/50 |
| 2018/0240859 | A1* | 8/2018 | Yang | H01L 24/05 |
| 2018/0342452 | A1* | 11/2018 | Kim | H01L 23/49811 |
| 2019/0393159 | A1* | 12/2019 | Chen | H01L 24/20 |

FOREIGN PATENT DOCUMENTS

| | | |
|---|---|---|
| CN | 102693992 | 9/2012 |
| CN | 108140559 | 6/2018 |
| CN | 108701697 A | 10/2018 |
| JP | H08-236001 | 9/1996 |
| JP | 2012-204501 | 10/2012 |
| JP | 2012-256736 | 12/2012 |
| JP | 2018-528622 | 9/2018 |
| KR | 20050030709 A | 3/2005 |

OTHER PUBLICATIONS

Official Action for China Patent Application No. 201980030713.3, dated Nov. 22, 2023, 19 pages.

Zhu Zhen, Tianjin, "Resource utilization technology of exhaust gas machine electronic appliances", Jan. 31, 2018, pp. 46-48, Science and Technology Press.

* cited by examiner

SEMICONDUCTOR APPARATUS AND ELECTRONIC EQUIPMENT

CROSS REFERENCE TO RELATED APPLICATIONS

This application is a national stage application under 35 U.S.C. 371 and claims the benefit of PCT Application No. PCT/JP2019/041079 having an international filing date of 18 Oct. 2019, which designated the United States, which PCT application claimed the benefit of Japanese Patent Application No. 2018-227349, filed 4 Dec. 2018, the entire disclosures of each of which are incorporated herein by reference.

TECHNICAL FIELD

The present technique relates to a semiconductor apparatus and electronic equipment.

BACKGROUND ART

A method is known in which electrodes provided on lamination surfaces of substrates are directly bonded to laminate the substrates to each other. For example, PTL 1 discloses that dummy electrodes including Cu are disposed on bonding surfaces of a first interconnect layer and a second interconnect layer and are bonded to each other.

CITATION LIST

Patent Literature

[PTL 1]
Japanese Patent Laid-Open No. 2012-256736

SUMMARY

Technical Problem

The bonding surfaces of the substrates are subjected to CMP (Chemical Mechanical Polishing) treatment before bonding and are thus flattened. The CMP treatment may cause depression such as recesses, dishing, or erosion in a region including electrodes (hereinafter referred to as an electrode region). The depression in the electrode region moves the surfaces of the electrodes backward in the depth direction of the substrates, preventing the electrodes from sufficiently contacting each other. Prevention of the contact between the electrodes may reduce the bondability between the electrodes.

In view of such circumstances, an object of the present disclosure is to provide a semiconductor apparatus and electronic equipment that allow improvement of bondability between a first electrode section and a second electrode section facing each other.

Solution to Problem

An aspect of the present disclosure is a semiconductor apparatus or electronic equipment including a first interconnect section, a first interlayer insulating film covering one surface side of the first interconnect section, a first electrode section provided in a first through-hole provided in the first interlayer insulating film, the first electrode section being electrically connected to the first interconnect section, a second interconnect section, a second interlayer insulating film covering a surface side of the second interconnect section facing the first interconnect section, and a second electrode section provided in a second through-hole provided in the second interlayer insulating film, the second electrode section being electrically connected to the second interconnect section. The first electrode section and the second electrode section are directly bonded to each other, and the first electrode section has a larger coefficient of thermal expansion than a coefficient of thermal expansion of the first interconnect section. The coefficient of thermal expansion refers to a rate at which the length or volume of an object is increased due to a rise in temperature, the rate being expressed per temperature. The coefficient of thermal expansion may be referred to as a thermal expansion coefficient.

Accordingly, even in a case where CMP treatment or the like during formation of the first electrode section causes depression such as recesses, dishing, or erosion in a front surface of the first electrode section, subsequent thermal treatment thermally expands the first electrode section more significantly than the first interconnect section. This facilitates making the front surface of the first electrode section closer to the second electrode section facing the first electrode section. Thus, the bondability (for example, the bonding strength) between the first electrode section and the second electrode section can be improved.

DESCRIPTION OF EMBODIMENTS

Embodiments of the present disclosure will be described below with reference to the drawings. In the description of the drawings referred to below, the same or similar portions are denoted by the same or similar reference signs. However, the drawings are schematic, and it should be noted that the relation between thickness and plane dimensions, the ratio between the thicknesses of layers, and the like differ from the actual relation, ratio, and the like. Thus, specific thicknesses and dimensions should be determined taking the description below into account. Additionally, needless to say, the drawings include portions with different dimensional relations or ratios.

Additionally, the definition of directions such as up and down in the description below is only for convenience of description, and is not intended to limit the technical concepts of the present disclosure. For example, needless to say, rotating an object through 90° for observation allows the reader to convert up and down into left and right for interpretation, and rotating the object through 180° allows the reader to invert up and down for interpretation.

Figure 1:
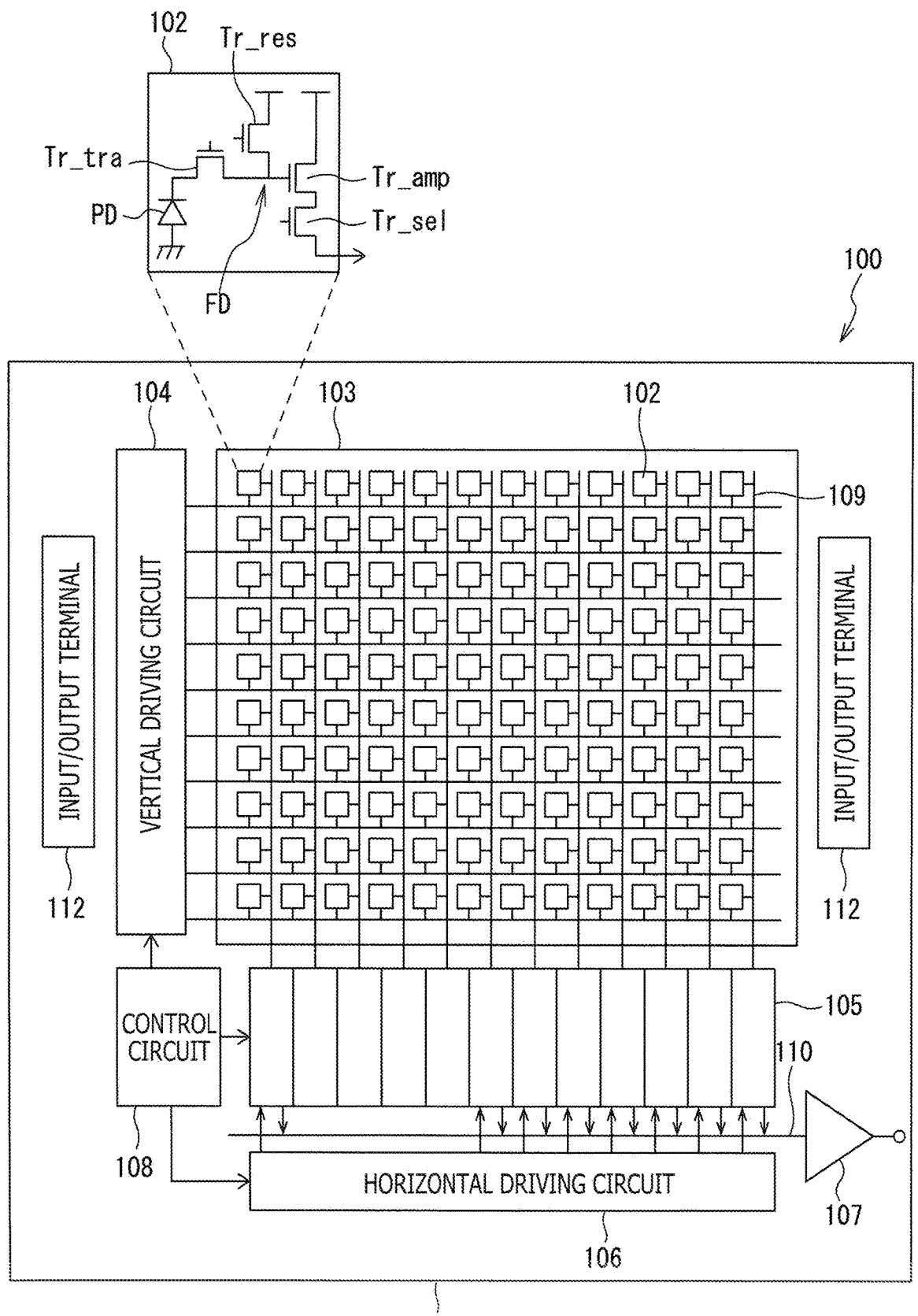
FIG. 1 is a diagram depicting a configuration example of a solid-state image pickup apparatus according to an embodiment of the present disclosure.

FIG. 1 is a diagram depicting a configuration example of a solid-state image pickup apparatus according to an embodiment of the present disclosure. A solid-state image pickup apparatus 100 depicted in FIG. 1 is an example of a semiconductor apparatus, and is, for example, a CMOS solid-state image pickup apparatus. As depicted in FIG. 1, the solid-state image pickup apparatus 100 includes a semiconductor substrate 111, a pixel region 103 in which pixels 102 including a plurality of photoelectric conversion sections are regularly arranged in a two-dimensional array, and a peripheral circuit section. The semiconductor substrate 111 is, for example, a silicon substrate. The pixel region 103 may be referred to as a pixel array. The pixel 102 includes the photoelectric conversion section and a plurality of pixel transistors. For example, the photoelectric conversion section includes a photodiode PD. The pixel transistor includes a transfer transistor Tr_tra, a reset transistor Tr_res, an amplifying transistor Tr_amp, and a selection transistor Tr_sel. The transfer transistor Tr_tra, the reset transistor Tr_res, the amplifying transistor Tr_amp, and the selection transistor Tr_sel each include a MOS transistor.

The photodiode PD receives and is photoelectrically converted by light incidence, and includes a region in which signal charge generated by the photoelectric conversion is accumulated. The transfer transistor Tr_tra is a transistor that reads the signal charge accumulated in the photodiode PD, into a floating diffusion (FD) region described below. The reset transistor Tr_res is a transistor for setting a potential of the floating diffusion (FD) region to a specified value. The amplifying transistor Tr_amp is a transistor for electrically amplifying the signal charge read into the floating diffusion (FD) region. The selection transistor Tr_sel is a transistor for selecting one row of pixels and reading pixel signals onto a vertical signal line 109. Although not depicted, the selection transistor Tr_sel may be omitted and the pixel may be configured using the three transistors and the photodiode PD.

In the circuit configuration of the pixel 102, a source of the transfer transistor Tr_tra is connected to the photodiode PD, and a drain of the transfer transistor Tr_tra is connected to a source of the reset transistor Tr_res. The floating diffusion region FD (corresponding to a drain region of the transfer transistor and a source region of the reset transistor) used as charge-voltage conversion means between the transfer transistor Tr_tra and the reset transistor Tr_res is connected to a gate of the amplifying transistor Tr_amp. A source of the amplifying transistor Tr_amp is connected to a drain of the selection transistor Tr_sel. A drain of the reset transistor Tr_res and a drain of the amplifying transistor Tr_amp are connected to a power supply voltage supply section. Additionally, a source of the selection transistor Tr_sel is connected to the vertical signal line 109.

The peripheral circuit section includes a vertical driving circuit 104, a column signal processing circuit 105, a horizontal driving circuit 106, an output circuit 107, and a control circuit 108. The control circuit 108 generates clock signals and control signals used as references for operations of the vertical driving circuit 104, the column signal processing circuit 105, the horizontal driving circuit 106, and the like. The control circuit 108 inputs these signals to the vertical driving circuit 104, the column signal processing circuit 105, the horizontal driving circuit 106, and the like.

The vertical driving circuit 104 includes, for example, a shift register. The vertical driving circuit 104 sequentially selects and scans the pixels 102 in the pixel region 103 in units of rows in a vertical direction. Then, the vertical driving circuit 104 feeds, to the column signal processing circuit 105 through the vertical signal line 109, a pixel signal based on signal charge generated by each pixel 102 according to an amount of light received.

For example, the vertical driving circuit 104 is connected to each of the gates of the transfer transistor Tr_tra, the reset transistor Tr_res, and the selection transistor Tr_sel via respective interconnects. The vertical driving circuit 104 applies a signal to each of the gates of the transfer transistor Tr_tra, the reset transistor Tr_res, and the selection transistor Tr_sel via interconnects to allow the gate to be brought into an on state or an off state.

Operation in the pixel 102 is performed in accordance with the following procedure. First, the vertical driving circuit 104 brings the gate of the transfer transistor Tr_tra and the gate of the reset transistor Tr_res into the on state to remove all the charge in the photodiode PD. Then, the vertical driving circuit 104 brings the gate of the transfer transistor Tr_tra and the gate of the reset transistor Tr_res into the off state to accumulate charge. Then, immediately before reading the charge in the photodiode PD, the vertical driving circuit 104 brings the gate of the reset transistor Tr_res into the on state to reset the potential of the floating diffusion region FD. Subsequently, the vertical driving circuit 104 brings the gate of the reset transistor Tr_res into the off state and brings the gate of the transfer transistor Tr_tra into the on state to transfer the charge from the photodiode PD to the floating diffusion region FD. In response to application of charge to the gate, the amplifying transistor Tr_amp electrically amplifies the signal charge. The vertical driving circuit 104 brings the gate of the selection transistor Tr_sel into the on state to output, to the vertical signal line 109, an image signal resulting from a charge-voltage conversion by the amplifying transistor Tr_amp.

The column signal processing circuit 105 is disposed for each row of the pixels 102. The column signal processing circuit 105 executes signal processing such as processing for removing fixed pattern noise specific to the pixel 102, signal amplification, an AD conversion, and the like. An output stage of the column signal processing circuit 105 is connected to a horizontal signal line 110 via a horizontal selection switch (not depicted). The horizontal driving circuit 106 includes, for example, a shift register. The horizontal driving circuit 106 selects each of the column signal processing circuits 105 in sequence to cause a pixel signal to be output from the column signal processing circuit 105 to the horizontal signal line 110.

The output circuit 107 executes signal processing on signals sequentially fed from the column signal processing circuits 105 through the horizontal signal line 110, and outputs the processed signals. For example, the output circuit 107 may exclusively perform buffering or may perform black level adjustment, column misalignment correction, various digital signal processing, and the like. An input/output terminal 112 is used to exchange signals with an external apparatus.

Figure 2:
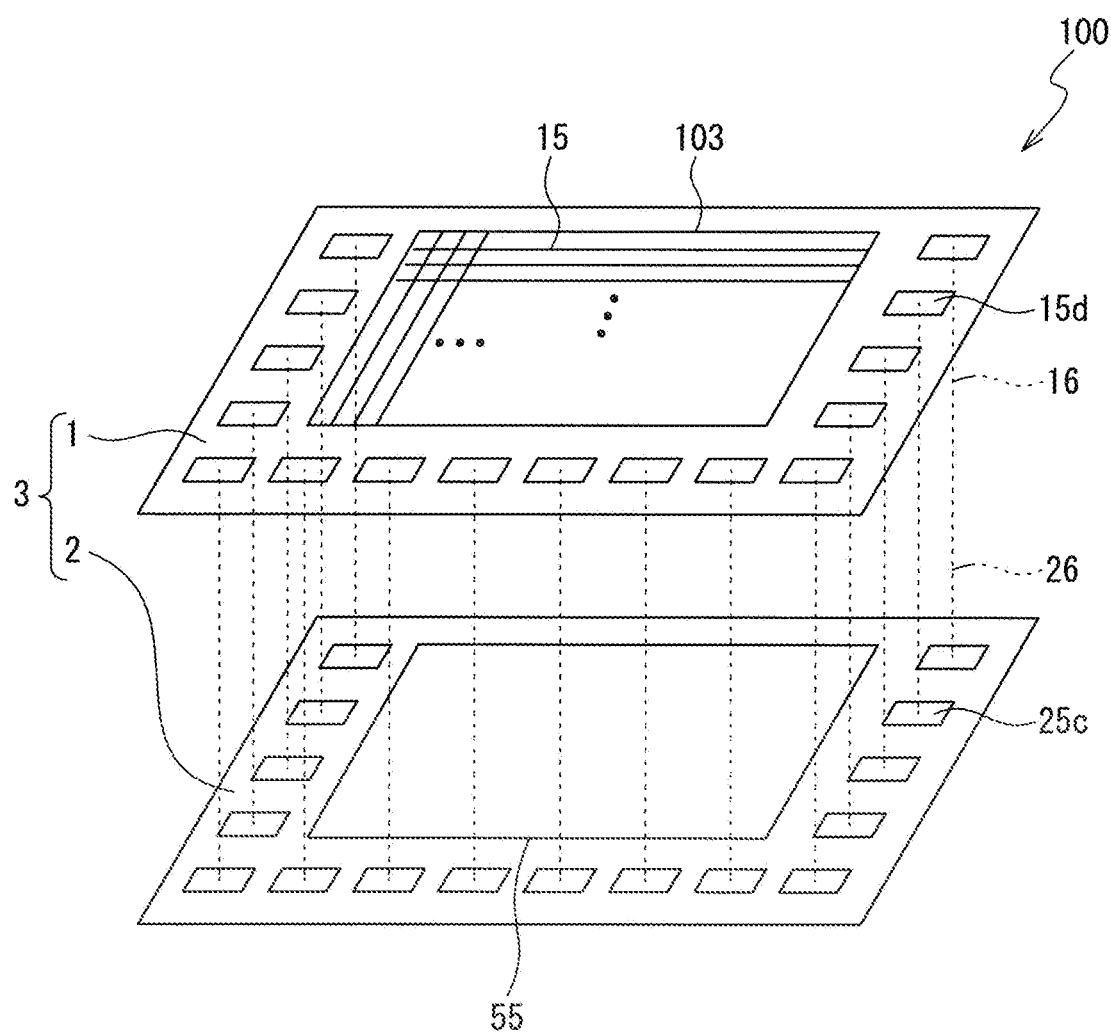
FIG. 2 is a schematic diagram depicting a configuration example of the solid-state image pickup apparatus according to an embodiment of the present disclosure.

FIG. 2 is a schematic diagram depicting a configuration example of the solid-state image pickup apparatus according to an embodiment of the present disclosure. As depicted in FIG. 2, the solid-state image pickup apparatus 100 includes a pixel chip 1 and a logic chip 2 located to face the pixel chip 1. The pixel chip 1 is provided with the pixel region 103 with a plurality of the pixels 102. The logic chip 2 is provided with a logic circuit 55 executing various steps of signal processing related to operations of the solid-state image pickup apparatus 100. The logic circuit 55 may be, for example, any one or more of the vertical driving circuit 104, the column signal processing circuit 105, the horizontal driving circuit 106, the output circuit 107, and the control circuit 108 depicted in FIG. 1. Note that, in the present embodiment, a part of the logic circuit 55 may be provided not only in the logic chip 2 but also in the pixel chip 1. For example, at least some of the vertical driving circuit 104, the column signal processing circuit 105, and the control circuit 108 may be provided on the pixel chip 1.

The pixel chip 1 includes a plurality of interconnects 15*d* provided at an outer peripheral portion of the pixel chip 1, and a plurality of first electrode sections 16 electrically connected to the plurality of interconnects 15*d*. The plurality of first electrode sections 16 is provided on a surface (for example, a lower surface) side of the pixel chip 1 that faces the logic chip 2. Additionally, the logic chip 2 includes a plurality of interconnects 25c provided at an outer peripheral portion of the logic chip 2 and a plurality of second electrode sections 26 electrically connected to the plurality of interconnects 25c. The plurality of second electrode sections 26 is provided on a surface (for example, an upper surface) side of the logic chip 2 that faces the pixel chip 1. The first electrode sections 16 and the second electrode sections 26 are bonded together in such a manner as to face each other. Accordingly, the interconnects 15d of the pixel chip 1 are electrically connected to the interconnects 25c of the logic chip 2 via the first electrode section 16 and the second electrode section 26. The first electrode section 16 and the second electrode section 26 are used as connection terminals for communication between the pixel chip 1 and the logic chip 2.

In the present embodiment, a structure with the pixel chip 1 and the logic chip 2 laminated to each other is referred to as a lamination chip 3. Bonding between the first electrode section 16 and the second electrode section 26 is achieved by laminating the pixel chip 1 and the logic chip 2 into the lamination chip 3.

Figure 3:
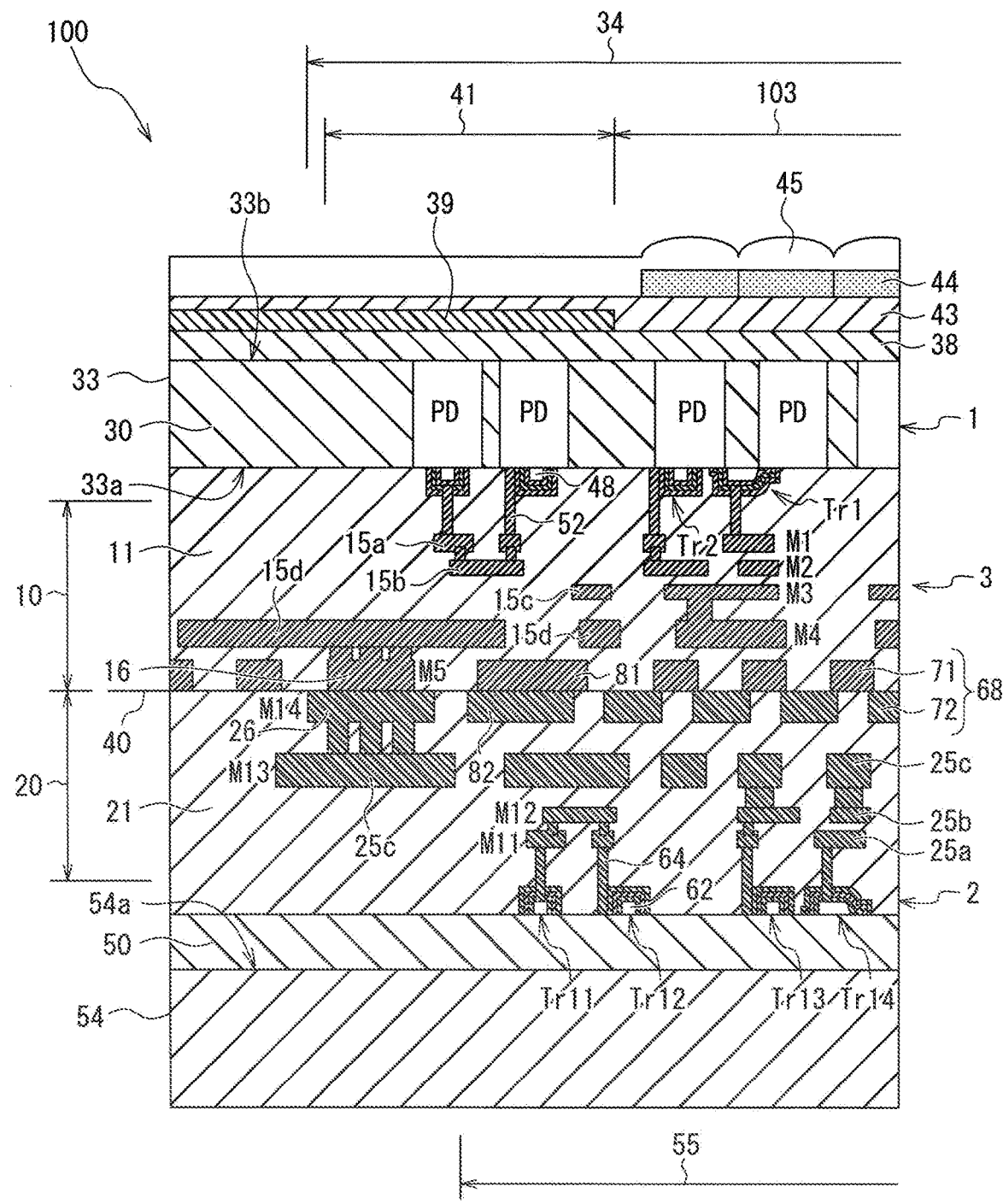
FIG. 3 is a schematic diagram depicting a configuration example of the solid-state image pickup apparatus according to an embodiment of the present disclosure.

FIG. 3 is a cross-sectional view depicting a configuration example of the solid-state image pickup apparatus according to an embodiment of the present disclosure. The solid-state image pickup apparatus 100 in FIG. 3 is, for example, a back-illuminated CMOS solid-state image pickup apparatus. As depicted in FIG. 3, the solid-state image pickup apparatus 100 includes the pixel chip 1 with the pixel region 103 and the logic chip 2 with the logic circuit 55. The lower surface of the pixel chip 1 is laminated to the upper surface of the logic chip 2 to form the lamination chip 3. The pixel chip 1 and the logic chip 2 are laminated to each other in such a manner that the first electrode section 16 and the second electrode section 26 face each other and are directly bonded together.

The pixel chip 1 includes a semiconductor substrate 33. The semiconductor substrate 33 includes silicon formed into a thin film. The semiconductor substrate 33 is provided with a well region 30, a plurality of photodiodes PD corresponding to a photoelectric conversion section, and a plurality of pixel transistors Tr1 and Tr2. As illustrated in FIG. 1, the pixel transistors include a transfer transistor Tr_tra, a reset transistor Tr_res, an amplifying transistor Tr_amp, and a selection transistor Tr_sel. Each of the pixel transistors Tr1 and Tr2 depicted in FIG. 3 is one of the above-described various transistors included in the pixel transistors, for example, the transfer transistor Tr_tra. The well region 30 is provided with the photodiodes PD and the pixel transistors Tr1 and Tr2. Although not depicted, the semiconductor substrate 33 may be provided with a plurality of MOS transistors forming a part of the logic circuit 55. A front surface (in FIG. 3, a lower surface) 33a side of the semiconductor substrate 33 is provided with interconnects 15a to 15d arranged in multiple layers via a first interlayer insulating film 11 and the first electrode section 16.

In this example, five layers of metals M1 to M5 form the interconnects 15a to 15d and the first electrode section 16. For example, the interconnect 15a includes the metal M1. The interconnect 15b includes the metal M2. The interconnect 15c includes the metal M3. The interconnect 15d includes the metal M4. The first electrode section 16 includes the metal M5. The interconnects 15a to 15d and the first electrode section 16 form a multilayer interconnect 10.

The interconnects 15a to 15d include, for example, copper (Cu) or gold (Au). The first electrode section 16 includes, for example, a copper (Cu) alloy or a gold (Au) alloy. The interconnects 15a to 15d and the first electrode section 16 are formed by a single damascene method or a dual damascene method.

A back surface (in FIG. 3, an upper surface) 33b side of the semiconductor substrate 33 is provided with a light shielding film 39 via an insulating film 38. In the present embodiment, a region provided with the light shielding film 39 is referred to as an optical black region 41. The optical black region 41 is disposed externally surrounding the pixel region 103 in plan view. In the present embodiment, plan view means viewing an object in a normal direction of the back surface 33b of the semiconductor substrate 33.

Additionally, a flattening film 43 is provided on the insulating film 38. The light shielding film 39 is covered by the flattening film 43. A color filter 44 and an on-chip lens 45 are provided on the flattening film 43. Note that FIG. 3 depicts an aspect in which the color filter 44 and the on-chip lens 45 are disposed in the pixel region 103 and not in the optical black region 41. However, the present embodiment is not limited to this aspect. In the present embodiment, the color filter 44 and the on-chip lens 45 may be disposed not only in the pixel region 103 but also in the optical black region 41.

FIG. 3 depicts the pixel transistors Tr1 and Tr2 representing the plurality of pixel transistors. On the front surface 33a side of the semiconductor substrate 33, a gate electrode 48 is provided via a gate insulating film. The gate insulating film, the gate electrode 48, and a source drain region form each of the pixel transistors Tr1 and Tr2. Unit pixels are isolated from one another, for example, by element isolation regions (not depicted) of an STI (Shallow Trench Isolation) structure. The photodiode PD includes, for example, an n-type semiconductor region and a p-type semiconductor region 47.

The pixel transistors Tr1 and Tr2 and the interconnects 15a, and the interconnects 15 adjacent to each other in an up-down direction are electrically connected together via conductive vias 52. Additionally, of the interconnects 15, the interconnect 15d located in an uppermost layer (in FIG. 3, the lower side) electrically connects to the first electrode section 16. The first electrode section 16 faces a bonding surface 40 between the pixel chip 1 and the logic chip 2. A front surface (in FIG. 3, a lower surface) of the first electrode section 16 is exposed on a surface of the first interlayer insulating film 11 facing the logic chip 2.

The logic chip 2 includes a semiconductor substrate 54. The semiconductor substrate 54 includes silicon. A front surface 54a side of the semiconductor substrate 54 is provided with a well region 50. The logic circuit 55 is provided in the well region 50. The logic circuit 55 includes a plurality of MOS transistors Tr11 to Tr14 including CMOS transistors. The front surface (in FIG. 3, the upper surface) 54a side of the semiconductor substrate 54 is provided with the interconnects 25a to 25c arranged in multiple layers via a second interlayer insulating film 21 and the second electrode section 26.

In this example, four layers of metals M11 to M14 form the interconnects 25a to 25c and the second electrode section 26. For example, the interconnect 25a includes the metal M11. The interconnect 25b includes the metal M12. The interconnect 25c includes the metal M13. The second electrode section 26 includes the metal M14. The interconnects 25a to 25c and the second electrode section 26 form a multilayer interconnect 20.

The interconnects 25a to 25d include, for example, copper (Cu) or gold (Au). The second electrode section 26 includes, for example, a copper (Cu) alloy or a gold (Au) alloy. The interconnects 25a to 25d and the second electrode section 26 are formed by a single damascene method or a dual damascene method.

FIG. 3 depicts the MOS transistors Tr11 and Tr14 representing the plurality of MOS transistors included in the logic circuit 55. In the well region 50, a gate electrode 62 is provided via a gate insulating film. The gate insulating film, the gate electrode 62, and a source drain region form each of the MOS transistors Tr11 to Tr14. The MOS transistors Tr11 to Tr14 are isolated from one another, for example, by element isolation regions (not depicted) of an STI structure.

The MOS transistors Tr11 to Tr14 and the interconnects 25a, and the interconnects 25 adjacent to each other in the up-down direction are electrically connected together via conductive vias 64. Additionally, of the interconnects 25, the interconnect 25c located in an uppermost layer electrically connects to the second electrode section 26. The second electrode section 26 faces the bonding surface 40 between the pixel chip 1 and the logic chip 2. A front surface (in FIG. 3, an upper surface) of the second electrode section 26 is exposed on a surface of the second interlayer insulating film 21 facing the pixel chip 1.

In the solid-state image pickup apparatus 100, the first electrode section 16 and the second electrode section 26 are disposed overlapping each other in plan view and are directly bonded to each other. Accordingly, the pixel chip 1 and the logic chip 2 are integrated together.

Embodiment 1

Now, the lamination chip included in the solid-state image pickup apparatus 100 will be described in further detail.

Figure 7:
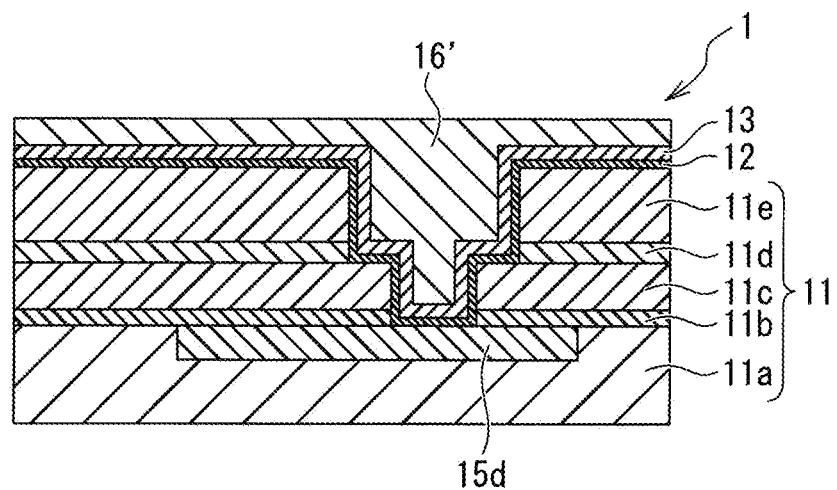
FIG. 7 is a cross-sectional view depicting, in order of steps, the method for manufacturing the lamination chip according to Embodiment 1 of the present disclosure.
Figure 8:
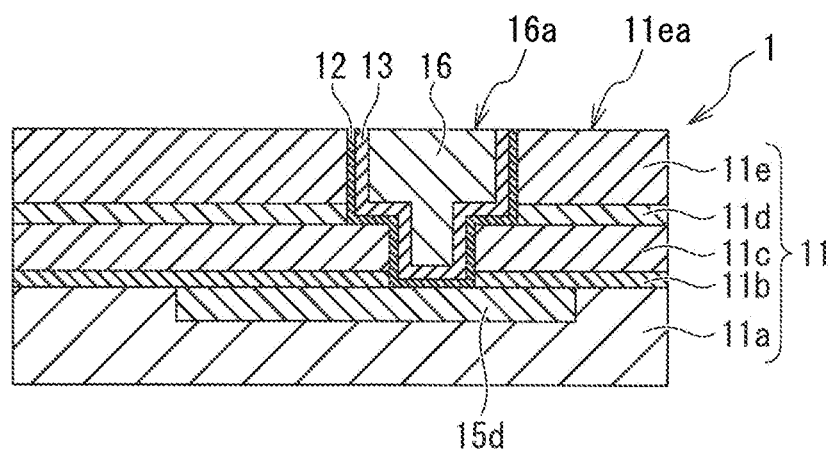
FIG. 8 is a cross-sectional view depicting, in order of steps, the method for manufacturing the lamination chip according to Embodiment 1 of the present disclosure.
Figure 9:
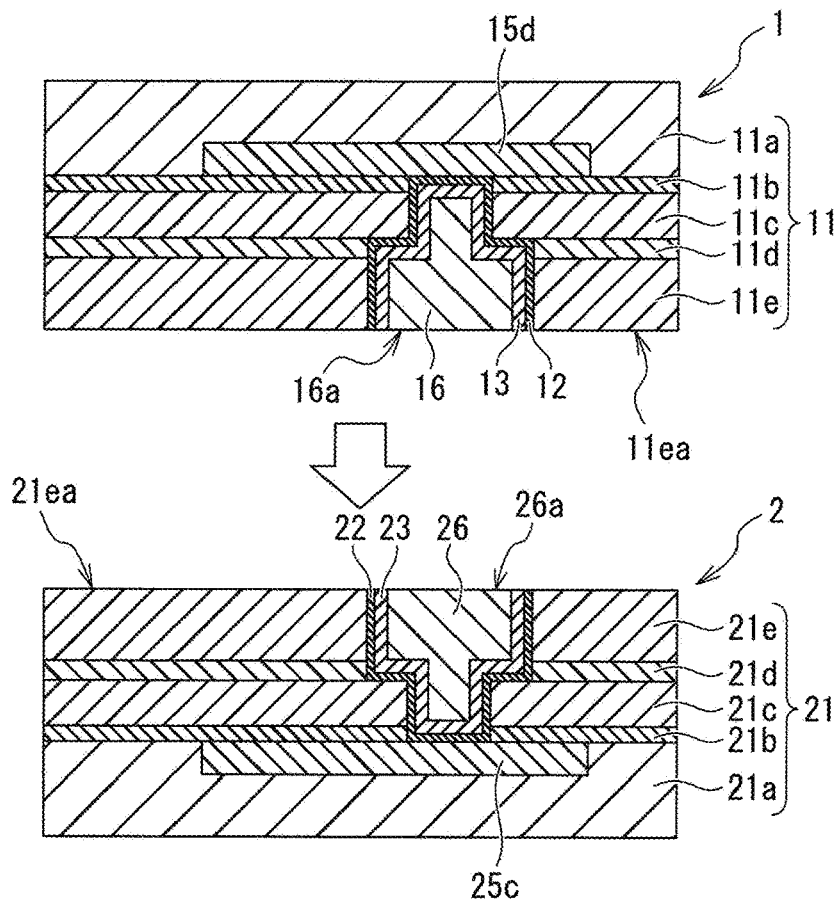
FIG. 9 is a cross-sectional view depicting, in order of steps, the method for manufacturing the lamination chip according to Embodiment 1 of the present disclosure.
Figure 10:
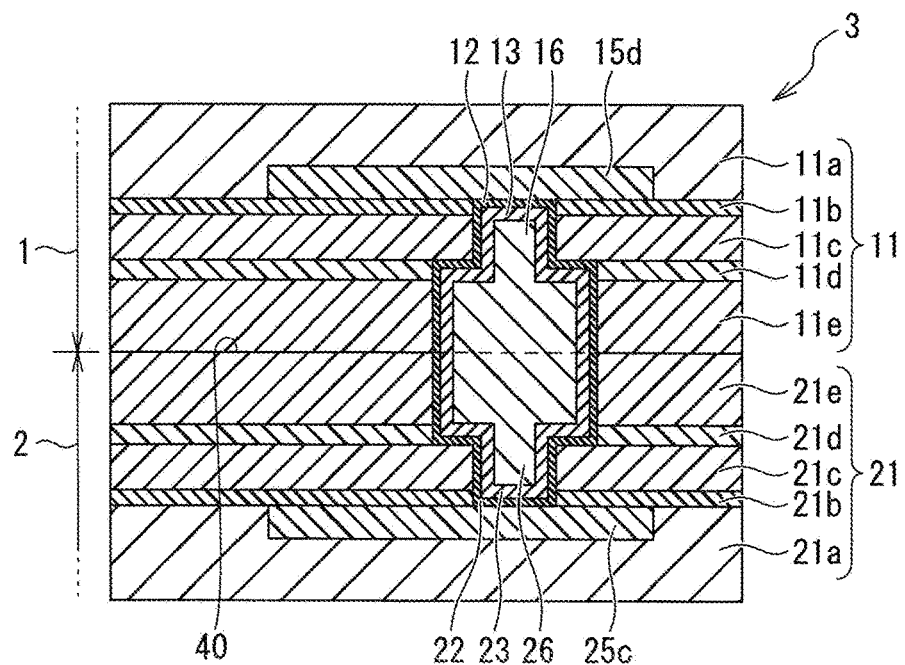
FIG. 10 is a cross-sectional view depicting, in order of steps, the method for manufacturing the lamination chip according to Embodiment 1 of the present disclosure.

FIGS. 4 to 10 are cross-sectional views depicting, in order of steps, a method for manufacturing a lamination chip according to Embodiment 1 of the present disclosure. Specifically, FIGS. 4 to 8 are cross-sectional views depicting, in order of steps, a method for forming the first electrode section 16. FIG. 9 is a cross-sectional view depicting a step of laminating the pixel chip 1 with the first electrode section 16 to the logic chip 2 with the second electrode section 26. FIG. 10 is a cross-sectional view depicting the lamination chip 3 formed by laminating the pixel chip 1 to the logic chip 2. The lamination chip 3 is manufactured using any of various apparatuses such as a film formation apparatus (including a CVD (Chemical Vapor Deposition) apparatus and a sputter apparatus), a thermal treatment apparatus, an etching apparatus, and a lamination apparatus. These apparatuses are hereinafter collectively referred to as a manufacturing apparatus.

Figure 4:
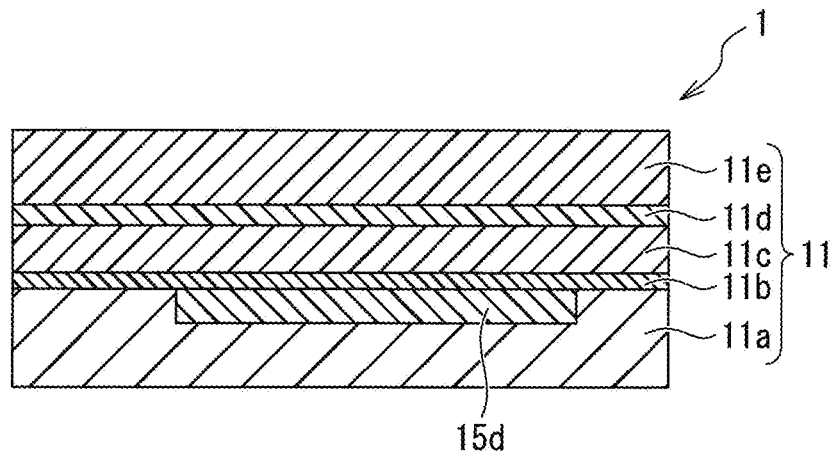
FIG. 4 is a cross-sectional view depicting, in order of steps, a method for manufacturing a lamination chip according to Embodiment 1 of the present disclosure.

As depicted in FIG. 4, the first interlayer insulating film 11 includes, for example, a first insulating film 11a, a second insulating film 11b, a third insulating film 11c, a fourth insulating film 11d, and a fifth insulating film 11e. The first to fifth insulating films 11a to 11e are each a silicon oxide film ($SiO_2$ film) or a silicon nitride film (SiN film). By way of example, the first insulating film 11a, the third insulating film 11c, and the fifth insulating film 11e are each a silicon oxide film, and the second insulating film 11b and the fourth insulating film 11d are each a silicon nitride film. In the solid-state image pickup apparatus 100 depicted in FIG. 3, the first insulating film 11a is located on the semiconductor substrate 33 side, and the fifth insulating film 11e is located on the bonding surface 40 side. The interconnects 15d are located between the first insulating film 11a and the second insulating film 11b. Additionally, in the first interlayer insulating film 11, interconnects or the like not depicted may be disposed between one and another of insulating films adjacent to each other in a thickness direction (in FIG. 4, the up-down direction).

Figure 5:
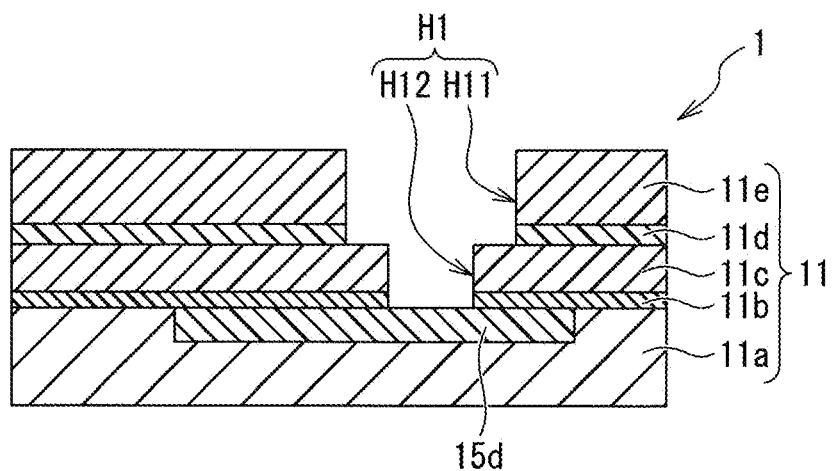
FIG. 5 is a cross-sectional view depicting, in order of steps, the method for manufacturing the lamination chip according to Embodiment 1 of the present disclosure.

The manufacturing apparatus uses the dual damascene method to form the first electrode section 16 depicted in FIG. 3. For example, as depicted in FIG. 5, the manufacturing apparatus etches each of the fifth insulating film 11e and the fourth insulating film 11d to form a trench (interconnect groove) H11 penetrating the fifth insulating film 11e and the fourth insulating film 11d. Then, the manufacturing apparatus etches the third insulating film 11c exposed on a bottom surface of the trench H11 and the second insulating film 11b located below the third insulating film 11c to form a via hole (connection hole) H12 penetrating the third insulating film 11c and the second insulating film 11b. A front surface of the interconnect 15d is exposed on a bottom surface of the via hole H12. The trench H11 and the via hole H12 are collectively referred to as a trench via H1.

Figure 6:
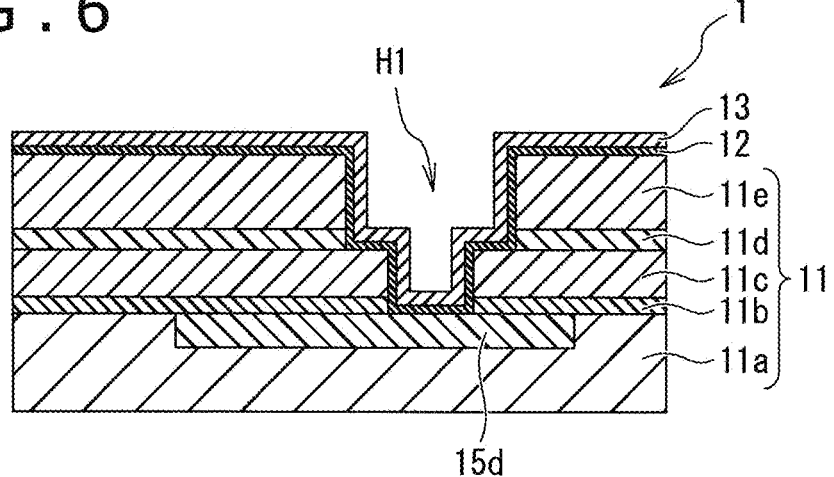
FIG. 6 is a cross-sectional view depicting, in order of steps, the method for manufacturing the lamination chip according to Embodiment 1 of the present disclosure.

Then, as depicted in FIG. 6, the manufacturing apparatus sequentially forms a barrier layer 12 and an alloy seed layer 13 on the first interlayer insulating film 11 provided with the trench via H1. A method for forming the barrier layer 12 and the alloy seed layer 13 is, for example, a sputter method. The barrier layer 12 is formed to prevent the material (for example, Cu or Au) forming the first electrode section 16 formed in the trench via H1 from diffusing around the first electrode section 16. The barrier layer 12 includes, for example, tantalum (Ta), tantalum nitride (TaN), titanium (Ti), titanium nitride (TiN), or an alloy film including any of these materials.

The alloy seed layer 13 is a layer used as a base for a metal plating layer 16' described below. The alloy seed layer is formed to enable the metal plating layer 16' to be formed by a plating method and to improve adhesion of the metal plating layer 16' to the base. Additionally, as described below, the alloy seed layer 13 is formed to feed impurities to the first electrode section 16. The impurities fed by the alloy seed layer 13 have a function to increase a coefficient of thermal expansion of the first electrode section 16. An example of the impurities having this function may be manganese (Mn), aluminum (Al), tin (Sn), or zinc (Zn). For example, the alloy seed layer 13 includes a copper (Cu) alloy or a gold (Au) alloy, and includes at least one type of impurities described above. By way of example, the alloy seed layer 13 includes CuMn, CuAl, AuMn, or AuAl.

Then, as depicted in FIG. 7, the manufacturing apparatus forms the metal plating layer 16' on the alloy seed layer 13. The metal plating layer 16' includes high-purity Cu (or Au) containing no impurities, for example, Mn, Al, Sn, or Zn. By way of example, the metal plating layer 16' includes Cu or Au. Then, the manufacturing apparatus executes CMP (Chemical Mechanical Polishing) treatment on the metal plating layer 16' and the alloy seed layer 13 and the barrier layer 12 located below the metal plating layer 16' to flatten these layers. As illustrated in FIG. 8, the manufacturing apparatus executes the CMP treatment until a front surface (in FIG. 8, an upper surface) 11ea of the fifth insulating film 11e is exposed. Accordingly, the metal plating layer 16', the alloy seed layer 13, and the barrier layer 12 are removed from the front surface 11ea of the firth insulating film 11e, and are left only in the trench via H1. The metal plating layer 16' left in the trench via H1 forms the first electrode section 16.

The manufacturing apparatus forms the logic chip 2 depicted in FIG. 9, in parallel with formation of the pixel chip 1 or before or after the formation. The manufacturing apparatus forms the second electrode section 26 of the logic chip 2 using the dual damascene method, as is the case with the first electrode section 16 of the pixel chip 1. For example, as illustrated in FIG. 9, the second interlayer insulating film 21 of the logic chip 2 includes a first insulating film 21a, a second insulating film 21b, a third insulating film 21c, a fourth insulating film 21d, and a fifth insulating film 21e. The first to fifth insulating films 21a to 21e are each, for example, a silicon oxide film ($SiO_2$ film) or a silicon nitride film (SiN film). By way of example, the first insulating film 21a, the third insulating film 21c, and the fifth insulating film 21e are each a silicon oxide film, and the second insulating film 21b and the fourth insulating film 21d are each a silicon nitride film. In the solid-state image pickup apparatus 100 depicted in FIG. 3, the first insulating film 21a is located on the semiconductor substrate 53 side, and the fifth insulating film 21e is located on the bonding surface 40 side. The interconnects 25d are located between the first insulating film 21a and the second insulating film 21b. Additionally, in the second interlayer insulating film 21, interconnects or the like not depicted may be disposed between one and another of insulating films adjacent to each other in the thickness direction (in FIG. 9, the up-down direction).

The manufacturing apparatus forms a trench via in the second interlayer insulating film 21 described above. Then, the manufacturing apparatus sequentially forms a barrier layer 22 and an alloy seed layer 23 on the second interlayer insulating film 21 provided with the trench via. The barrier layer 22 includes, for example, Ta, TaN, Ti, TiN, or an alloy film including any of these materials. The alloy seed layer 13 includes CuMn, CuAl, AuMn, or AuAl. Then, the manufacturing apparatus forms a metal plating layer on the alloy seed layer 23. The metal plating layer contains high-purity Cu or Au. Then, the manufacturing apparatus executes CMP treatment on the metal plating layer and on the alloy seed layer 23 and the barrier layer 22 located below the metal plating layer to flatten these layers. Thus, the metal plating layer forms the second electrode section 26.

After the pixel chip 1 and the logic chip 2 are prepared, the manufacturing apparatus places the first electrode section 16 of the pixel chip 1 to face the second electrode section 26 of the logic chip 2 as depicted in FIG. 9. Then, the manufacturing apparatus brings the pixel chip 1 and the logic chip 2 into close contact with each other and applies thermal treatment to the chips. Accordingly, as illustrated in FIG. 10, the first electrode section 16 and the second electrode section 26 are bonded and integrated together. The interconnects 15d of the pixel chip 1 are electrically connected to the interconnects 25d of the logic chip 2 via the first electrode section 16 and the second electrode section 26.

In FIG. 10, in a case where the first electrode section 16 includes Cu, the second electrode section 26 also includes Cu. In this case, the first electrode section 16 and the second electrode section 26 are Cu—Cu bonded. Alternatively, in FIG. 10, in a case where the first electrode section 16 includes Au, the second electrode section 26 also includes Au. In this case, the first electrode section 16 and the second electrode section 26 are Au—Au bonded.

Additionally, the first interlayer insulating film 11 of the pixel chip 1 and the second interlayer insulating film 21 of the logic chip 2 are bonded and integrated together. For example, in the bonding, the front surface (in FIG. 9, the lower surface) 11ea of the fifth insulating film 11e included in the first interlayer insulating film 11 is in close contact with a front surface (in FIG. 9, an upper surface) 21ea of the fifth insulating film 21e included in the second interlayer insulating film 21.

The first electrode section 16 and the second electrode section 26 are bonded and the first interlayer insulating film 11 and the second interlayer insulating film 21 are bonded to laminate and integrate the pixel chip 1 and the logic chip 2 together, forming the lamination chip 3. The surface including a boundary between the first electrode section 16 and the second electrode section 26 and a boundary between the fifth insulating film 11e and the fifth insulating film 21e corresponds to the bonding surface 40 of the lamination chip 3.

Note that, in a case where the first electrode section 16 and the second electrode section 26 include Cu, then reduction treatment may be executed to remove an oxide film on the Cu surface before bonding. The reduction treatment uses, for example, hydrogen gas, a mixed gas of hydrogen and argon, hydrogen plasma, ammonia plasma, argon plasma, or the like. Cu is easily oxidized, but the above-described reduction treatment allows oxidation to be suppressed.

Figure 11:
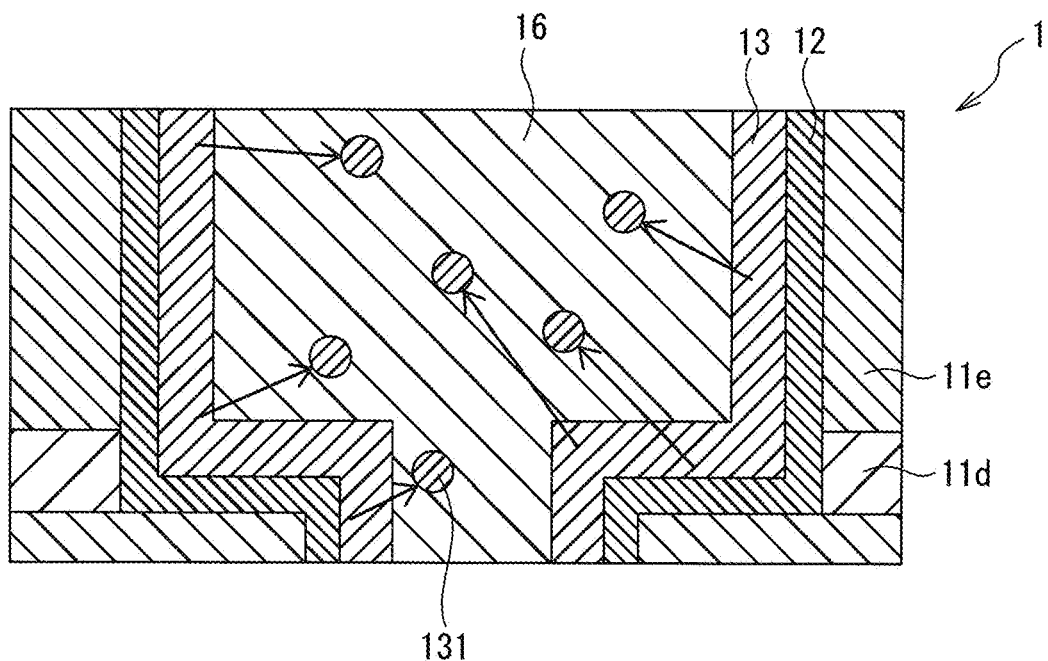
FIG. 11 is a cross-sectional view schematically depicting diffusion of impurities from an alloy seed layer to a first electrode section in a pixel chip according to Embodiment 1.

FIG. 11 is a cross-sectional view schematically depicting diffusion of impurities from the alloy seed layer to the first electrode section in the pixel chip according to Embodiment 1. As described above, the alloy seed layer 13 includes impurities such as Mn, Al, Sn, or Zn which increase the coefficient of thermal expansion of the first electrode section 16. The impurities thermally diffuse from the alloy seed layer 13 to the first electrode section 16. The above-described lamination step involves thermal treatment, and thus, as depicted in FIG. 11, impurities 131 such as Mn, Al, Sn, or Zn diffuse from the alloy seed layer 13 to the first electrode section 16, and the first electrode section 16 changes to an alloy containing the impurities 131. The first electrode section 16 changes from Cu (or Au) to a Cu alloy (or Au alloy).

Similarly, in the logic chip 2 as well, impurities such as Mn, Al, Sn, or Zn thermally diffuse from the alloy seed layer 23 to the second electrode section 26. Thus, the second electrode section 26 also changes from Cu (or Au) to a Cu alloy (or Au alloy).

Both Cu (or Au) and a Cu alloy (or Au alloy) containing the impurities 131 are expanded under thermal treatment, and the Cu alloy (or Au alloy) containing the impurities 131 has a higher coefficient of thermal expansion than Cu (or Au). In a case where they are thermally treated under the same conditions, the Cu alloy (or Au alloy) containing the impurities 131 thermally expands more significantly than Cu (or Au).

Figure 12:
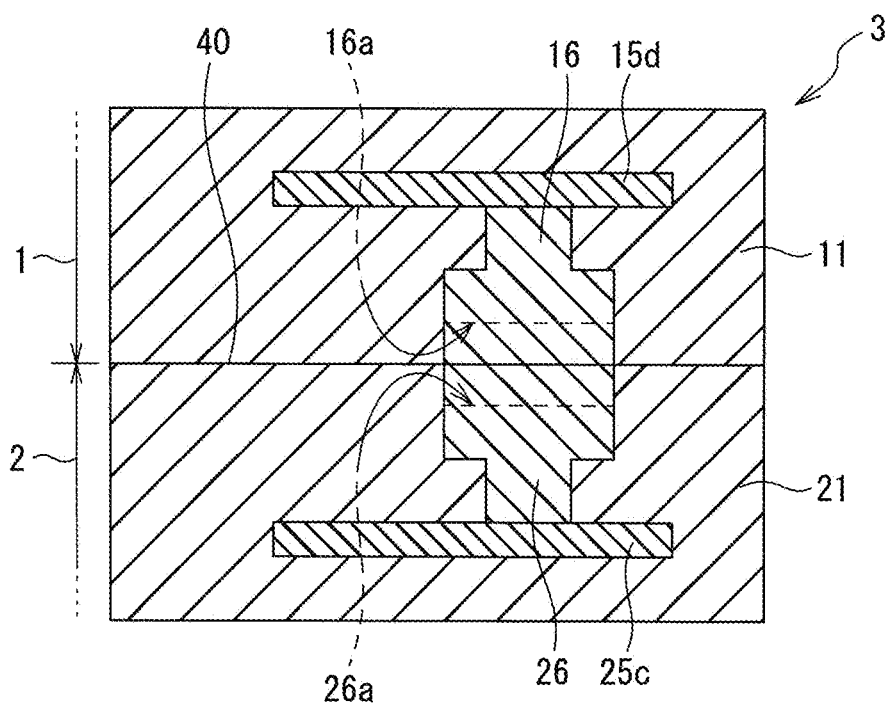
FIG. 12 is a cross-sectional view schematically depicting bonding based on thermal expansion of the first electrode section and a second electrode section in a lamination chip according to Embodiment 1.

FIG. 12 is a cross-sectional view schematically depicting bonding between the first electrode section and the second electrode section based on thermal expansion in the lamination chip according to Embodiment 1. In FIG. 12, the first electrode section 16 is alloyed by being fed with the impurities 131 from the alloy seed layer 13, and has a coefficient of thermal expansion increased compared to the coefficient of thermal expansion of high-purity Cu (or Au). Thus, even in a case where the CMP treatment before bonding leads to depression such as recesses, dishing, or erosion in a front surface 16a of the first electrode section 16 as depicted in FIG. 12, thermal treatment thermally expands the first electrode section 16 significantly. Even in a case where recesses or the like moves the front surface 16a of the first electrode section 16 backward from the surface 11ea (see FIG. 9) of the first interlayer insulating film 11, the first electrode section 16 thermally expands to restore the position of the front surface 16a from a dashed position to the position of the bonding surface 40.

Similarly, the second electrode section 26 is alloyed by being fed with the impurities from the alloy seed layer 23, and has a coefficient of thermal expansion increased compared to the coefficient of thermal expansion of high-purity Cu (or Au). Thus, even in a case where the CMP treatment before bonding leads to depression such as recesses, dishing, or erosion in a front surface 26a of the second electrode section 26 as depicted in FIG. 12, thermal treatment thermally expands the second electrode section 26 significantly. Even in a case where recesses or the like moves the front surface 26a of the second electrode section 16 backward from the surface 21ea (see FIG. 9) of the second interlayer insulating film 21, the second electrode section 26 thermally expands to restore the position of the front surface 26a from a dashed position to the position of the bonding surface 40.

Accordingly, the first electrode section 16 and the second electrode section 26 can be easily brought into contact with each other, enabling an increase in bonding strength between the first electrode section 16 and the second electrode section 26.

Additionally, high-purity Cu (or Au) tends to offer lower electrical resistance than the Cu alloy (or Au alloy). The interconnects 15d and 25d include high-purity Cu (or Au), and has a lower resistivity than the first electrode section 16 and the second electrode section 26. The lamination chip 3 allows coexistence between the interconnects 15d and 25d, which offer low resistance, and the first electrode section 16 and the second electrode section 26, which are easily bonded.

As described above, a semiconductor apparatus (for example, the solid-state image pickup apparatus 100) according to Embodiment 1 of the present disclosure includes a first interconnect section (for example, the interconnect 15d), the first interlayer insulating film 11 covering one surface side of the interconnect 15d, the first electrode section 16 provided in a first through-hole (for example, the trench via H1) provided in the first interlayer insulating film 11 and electrically connected to the interconnect 15d, a second interconnect section (for example, the interconnect 25c), the second interlayer insulating film 21 covering the surface side of the interconnect 25c facing the interconnect 15d, and the second electrode section 26 provided in a second through-hole (for example, the trench via H2) provided in the second interlayer insulating film 21 and electrically connected to the interconnect 25c. The first electrode section 16 and the second electrode section 26 are directly bonded to each other. The first electrode section 16 has a larger coefficient of thermal expansion than the interconnect 15d.

Accordingly, even in a case where, for example, the CMP treatment during formation of the first electrode section 16 leads to depression such as recesses, dishing, or erosion in the front surface of the first electrode section 16, subsequent thermal treatment thermally expands the first electrode section 16 more significantly than the interconnect 15d. This facilitates making the front surface of the first electrode section 16 closer to the second electrode section 26 facing the first electrode section 16. Thus, the bondability (for example, the bonding strength) between the first electrode section 16 and the second electrode section 26 can be improved.

Additionally, in the solid-state image pickup apparatus 100, the interconnect 15d includes a first metal (for example, Cu or Au). The first electrode section 16 includes an alloy containing Cu or Au and a second metal (for example, Mn, Al, Sn, or Zn). Accordingly, the coefficient of thermal expansion of the first electrode section 16 can be made larger than the coefficient of thermal expansion of the interconnect 15d. For example, assuming that the coefficient of thermal expansion of the first electrode section 16 is $\beta16$ and the coefficient of thermal expansion of the interconnect 15d is $\beta15$, a ratio ($\beta16/\beta15$) between the first electrode section 16 and the interconnect 15d can be set within a range of 1.01 or larger and 1.25 or smaller.

Additionally, the solid-state image pickup apparatus 100 further includes a first seed layer (for example, the alloy seed layer 13) provided in the trench via H1 and in contact with the first electrode section 16. The alloy seed layer 13 includes a second metal (for example, Mn, Al, Sn, or Zn). Accordingly, the first electrode section 16 can be formed by a plating method. Additionally, by diffusing Mn, Al, Sn, Zn, or the like from the alloy seed layer 13 to the first electrode section 16, the first electrode section 16 can be alloyed.

Additionally, in the solid-state image pickup apparatus 100, the second electrode section 26 has a larger coefficient of thermal expansion than the interconnect 25c. Accordingly, even in a case where, for example, the CMP treatment during formation of the second electrode section 26 leads to depression such as recesses, dishing, or erosion in the front surface of the second electrode section 26, subsequent thermal treatment thermally expands the second electrode section 26 more significantly than the interconnect 25c. This facilitates making the front surface of the second electrode section 26 closer to the first electrode section 16 facing the second electrode section 26. Thus, the bondability (for example, the bonding strength) between the first electrode section 16 and the second electrode section 26 can be improved.

Additionally, in the solid-state image pickup apparatus 100, the interconnect 25c includes a third metal (for example, Cu or Au). The second electrode section 26 includes an alloy containing Cu or Au and a fourth metal (for example, Mn, Al, Sn, or Zn). Accordingly, the coefficient of thermal expansion of the second electrode section 26 can be made larger than the coefficient of thermal expansion of the interconnect 25c. For example, assuming that the coefficient of thermal expansion of the second electrode section 26 is $\beta26$ and the coefficient of thermal expansion of the interconnect 25c is $\beta25$, a ratio ($\beta26/\beta25$) between the second electrode section 26 and the interconnect 25c can be set within a range of 1.01 or larger and 1.25 or smaller.

Furthermore, the solid-state image pickup apparatus 100 further includes a second seed layer (for example, an alloy seed layer 23) provided in the second through-hole (for example, the trench via H2) in contact with the second electrode section 26. The alloy seed layer 23 includes the fourth metal (for example, Mn, Al, Sn, or Zn). Accordingly, the second electrode section 26 can be formed by the plating method. Additionally, by diffusing Mn, Al, Sn, Zn, or the like from the alloy seed layer 23 to the second electrode section 26, the second electrode section 26 can be alloyed.

Note that the above-described first metal and third metal preferably include the same element. For example, the first metal and the third metal are each preferably Cu. Alternatively, the first metal and the third metal are each preferably Au. Accordingly, a matrix (main material) of the first electrode section 16 and a matrix of the second electrode section 26 include the same element, and this facilitates integration of the first electrode section 16 and the second electrode section 26 based on the bonding between the first electrode section 16 and the second electrode section 26 together.

Furthermore, the second metal and the fourth metal preferably include the same element. For example, the second metal and the fourth metal are each preferably Mn. Alternatively, the second metal and the fourth metal are each preferably Al. In a case where the first metal and the third metal include the same element and the second metal and the fourth metal include the same element, the first electrode section 16 and the second electrode section 26 include alloys with the same composition. This facilitates integration of the first electrode section 16 and the second electrode section 26 based on the bonding between the first electrode section 16 and the second electrode section 26 together.

Additionally, the solid-state image pickup apparatus 100 further includes a first barrier layer (for example, the barrier layer 12) provided in the trench via H1 and located between the interconnects 15d and the first electrode section 16, the first barrier layer having conductivity. Accordingly, the barrier layer 12 can prevent the material (for example, Cu or Au) included in the first electrode section 16 from diffusing around the first electrode section 16.

Additionally, the solid-state image pickup apparatus 100 further includes a second barrier layer (for example, the barrier layer 22) provided in the trench via H2 and located between the interconnects 25c and the second electrode section 26, the second barrier layer having conductivity. Accordingly, the barrier layer 22 can prevent the material (for example, Cu or Au) included in the second electrode section 26 from diffusing around the second electrode section 26.

Additionally, the solid-state image pickup apparatus 100 further includes a first substrate (for example, the semiconductor substrate 33) and a second substrate (semiconductor substrate 54) disposed to face one of the surfaces of the semiconductor substrate 33. The first electrode section 16 is provided on one surface side of the semiconductor substrate 33. The second electrode section 26 is provided on a surface side of the semiconductor substrate 54 that faces the semiconductor substrate 33.

Accordingly, the first electrode section 16 and the second electrode section 26 can electrically connect elements provided on the semiconductor substrate 33 (for example, the pixel transistors Tr1 and Tr2) to elements provided on the semiconductor substrate 54 (for example, the MOS transistors Tr11 to Tr14) via the interconnects 15 and 25c.

Note that, as depicted in FIG. 3, the solid-state image pickup apparatus 100 may include a light shielding section 71 and a light shielding section 72. For example, the light shielding section 71 includes the same metal M5 as that included in the first electrode section 16 and faces the bonding surface 40. The light shielding section 72 includes the same metal M14 as that included in the second electrode section 26 and faces the bonding surface 40. The light shielding sections 71 and 72 are disposed with ends of the light shielding section 71 overlapping ends of the light shielding section 72 in plan view, forming a multilayer light shielding section 68. Accordingly, the multilayer light shielding section 68 can shield the entire pixel region 103 from light. Additionally, the light shielding sections 71 and 72 include a Cu alloy (or an Au alloy) similarly to the first electrode section 16 and the second electrode section 26. The ends of the light shielding sections 71 and 72 are Cu—Cu bonded (or Au—Au bonded) together. Accordingly, the light shielding sections 71 and 72 contribute to improving the bonding strength between the pixel chip 1 and the logic chip 2.

Note that the multilayer light shielding section 68 is preferably connected to a fixed potential (for example, the ground potential) and thus stabilized in terms of potential. Accordingly, the multilayer light shielding section 68 provides not only a light shielding function but also a shield function for shielding the pixel chip 1 and the logic chip 2 from electromagnetic waves, possibly entering the pixel chip 1 and the logic chip 2. For example, the multilayer light shielding section 68 is disposed in the pixel region 103 and connected to the fixed potential to allow the photodiodes PD to be shielded from electromagnetic waves from the logic chip 2. The multilayer light shielding section 68 can prevent the photodiodes PD from being affected by noise from the logic chip 2.

Additionally, as depicted in FIG. 3, the solid-state image pickup apparatus 100 may include a first dummy electrode 81 and a second dummy electrode 82. For example, the first dummy electrode 81 and the second dummy electrode 82 are provided in the optical black region 41. The first dummy electrode 81 includes the same metal M5 as that of the first electrode section 16 and faces the bonding surface 40. The second dummy electrode 82 includes the same metal M14 as that of the second electrode section 26 and faces the bonding surface 40. The first dummy electrode 81 and the second dummy electrode 82 are disposed to overlap each other in plan view. Like the first electrode section 16 and the second electrode section 26, the first dummy electrode 81 and the second dummy electrode 82 include a Cu alloy (or an Au alloy) and are Cu—Cu bonded (or Au—Au bonded) together. Accordingly, the first dummy electrode 81 and the second dummy electrode 82 also contribute to improving the bonding strength between the pixel chip 1 and the logic chip 2. Note that the first dummy electrode 81 and the second dummy electrode 82 are preferably connected to a fixed potential (for example, the ground potential) and thus stabilized in terms of potential.

MODIFIED EXAMPLE

As described above in the embodiment, the connection terminal including the first electrode section 16 and the second electrode section 26 is disposed in the optical black region 41. However, in the embodiment, the connection terminal including the first electrode section 16 and the second electrode section 26 may be provided in the pixel region 103 rather than in the optical black region 41.

Additionally, in the above description of the embodiment, the first dummy electrode 81 and the second dummy electrode 82 are provided in the optical black region 41. However, in the embodiment of the present disclosure, the first dummy electrode 81 and the second dummy electrode 82 may be provided in the pixel region 103. Additionally, a plurality of the first dummy electrodes 81 and a plurality of the second dummy electrodes 82 may be provided.

Figure 13:
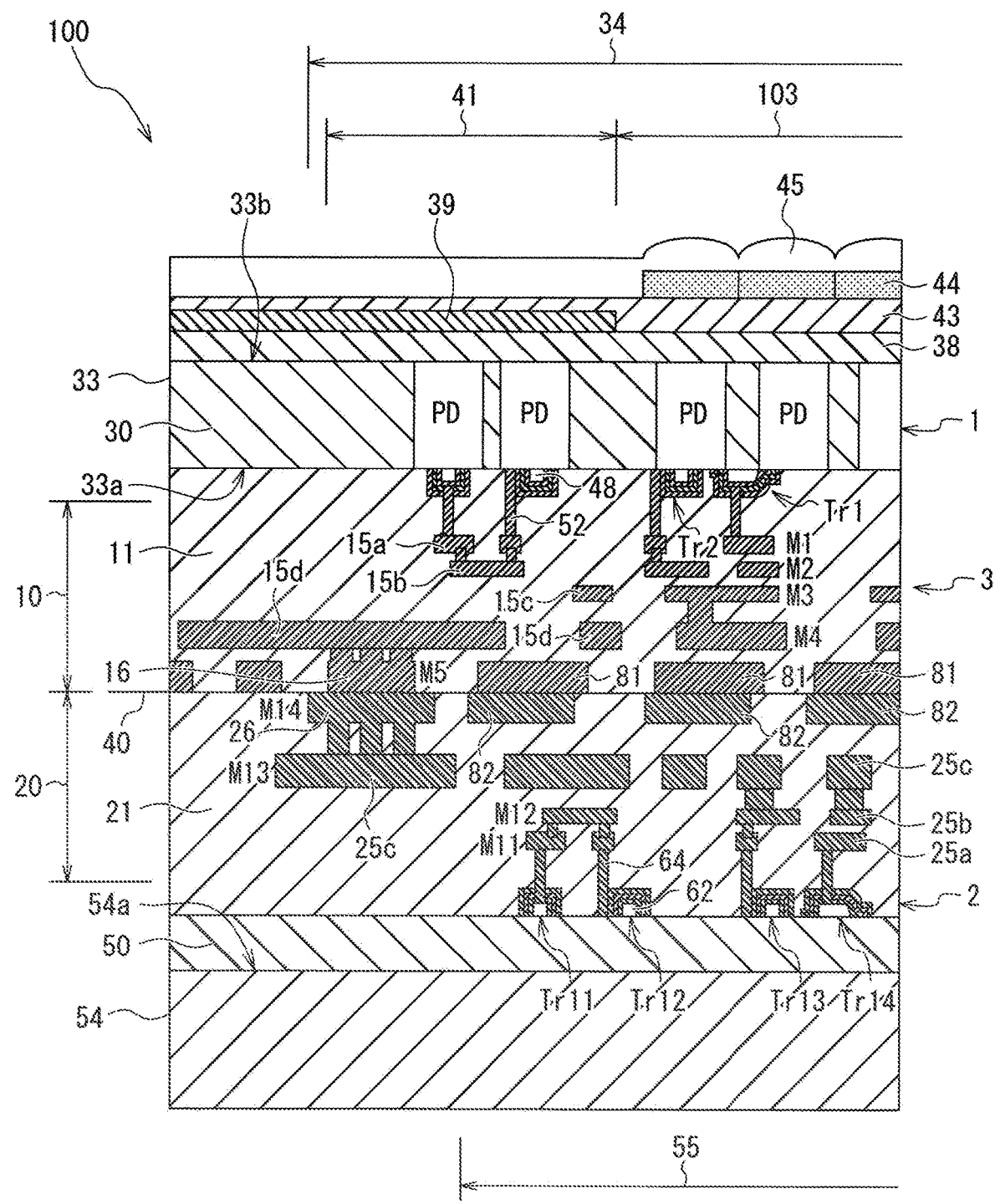
FIG. 13 is a cross-sectional view depicting Modified Example 1 of the solid-state image pickup apparatus according to an embodiment of the present disclosure.

FIG. 13 is a cross-sectional view illustrating Modified Example 1 of the solid-state image pickup apparatus according to an embodiment of the present disclosure. As depicted in FIG. 13, the solid-state image pickup apparatus 100 includes a plurality of the first dummy electrodes 81 provided in the pixel region 103 and a plurality of the second dummy electrodes 82 provided in the pixel region 103. For example, in the pixel region 103, each of the first dummy electrodes 81 is bonded to each of the second dummy electrodes 82. According to Modified Example 1 depicted in FIG. 13, the first dummy electrodes 81 and the second dummy electrodes 82 provided in the pixel region 103 also improve the bonding strength between the pixel chip 1 and the logic chip 2 in the pixel region 103.

In Modified Example 1 depicted in FIG. 13, the first dummy electrodes 81 may correspond to an example of the first electrode section in the present disclosure, and the second dummy electrodes 82 may correspond to an example of the second electrode section in the present disclosure. In other words, the first electrode section and the second electrode section may be used as dummy electrodes.

The first electrode section and the second electrode section in the present disclosure may be used as interconnects. The interconnects may be disposed in the optical black region 41 or in the pixel region 103.

Figure 14:
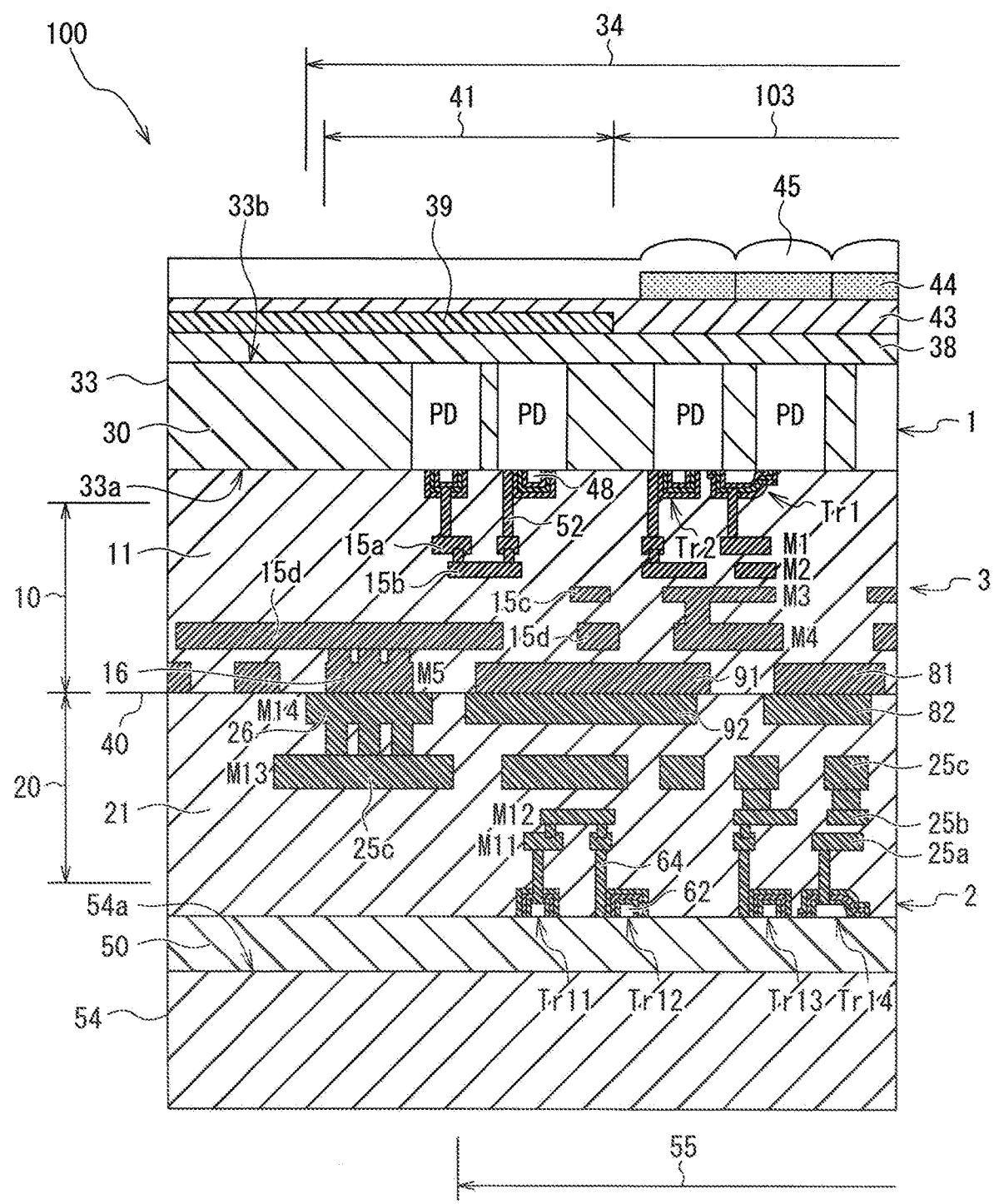
FIG. 14 is a cross-sectional view depicting Modified Example 2 of the solid-state image pickup apparatus according to an embodiment of the present disclosure.

FIG. 14 is a cross-sectional view depicting Modified Example 2 of the solid-state image pickup apparatus according to an embodiment of the present disclosure. As depicted in FIG. 14, the solid-state image pickup apparatus 100 includes an interconnect upper portion 91 provided in the optical black region 41 and the pixel region 103 and an interconnect lower portion 92 provided in the optical black region 41 and the pixel region 103. The interconnect upper portion 91 and the interconnect lower portion 92 form one interconnect. The interconnect upper portion 91 and the interconnect lower portion 92 are each utilized, for example, as a part of the interconnect for supplying power from the logic chip 2 to the pixel chip 1.

The interconnect upper portion 91 includes the same metal M5 as that included in the first electrode section 16 and faces the bonding surface 40. Although not depicted, the interconnect upper portion 91 is electrically connected to interconnects including, for example, the metal M4. The interconnect lower portion 92 includes the same metal M14 as that included in the second electrode section 26 and faces the bonding surface 40. Although not depicted, the interconnect lower portion 92 is electrically connected to interconnects including, for example, the metal M13. The interconnect upper portion 91 and the interconnect lower portion 92 are disposed to overlap each other in plan view. Like the first electrode section 16 and the second electrode section 26, the interconnect upper portion 91 and the interconnect lower portion 92 include a Cu alloy (or an Au alloy) and are Cu—Cu bonded (or Au—Au bonded) together. The interconnect upper portion 91 and the interconnect lower portion 92 are bonded together to form an interconnect.

According to Modified Example 2 depicted in FIG. 14, the interconnect upper portion 91 and the interconnect lower portion 92 are Cu—Cu bonded (or Au—Au bonded) together to form an interconnect and to improve the bonding strength between the pixel chip 1 and the logic chip 2. In Modified Example 2 depicted in FIG. 14, the interconnect upper portion 91 may correspond to an example of the first electrode section in the present disclosure, and the interconnect lower portion 92 may correspond to an example of the second electrode section in the present disclosure.

As described above in Embodiment 1, the thermal treatment during lamination of the pixel chip 1 and the logic chip 2 causes the impurities 131 to diffuse from the alloy seed layer 13 to the first electrode section 16, which is thus alloyed. However, in the present embodiment, the thermal treatment for alloying is not limited to the thermal treatment during lamination of the pixel chip 1 and the logic chip 2. In the present embodiment, after formation of the first electrode section 16 by CMP treatment and before lamination of the pixel chip 1 and the logic chip 2, the pixel chip 1 may be thermally treated in advance to alloy the first electrode section 16. Similarly, after formation of the second electrode section 26 by CMP treatment and before lamination of the pixel chip 1 and the logic chip 2, the logic chip 2 may be thermally treated in advance to alloy the second electrode section 26. Accordingly, the front surface 16a of the first electrode section 16 or the front surface 26a of the second electrode section 26, which has been moved backward by CMP treatment, can be restored in advance to a position becoming the bonding surface 40 before lamination of the pixel chip 1 and the logic chip 2.

Figure 15:
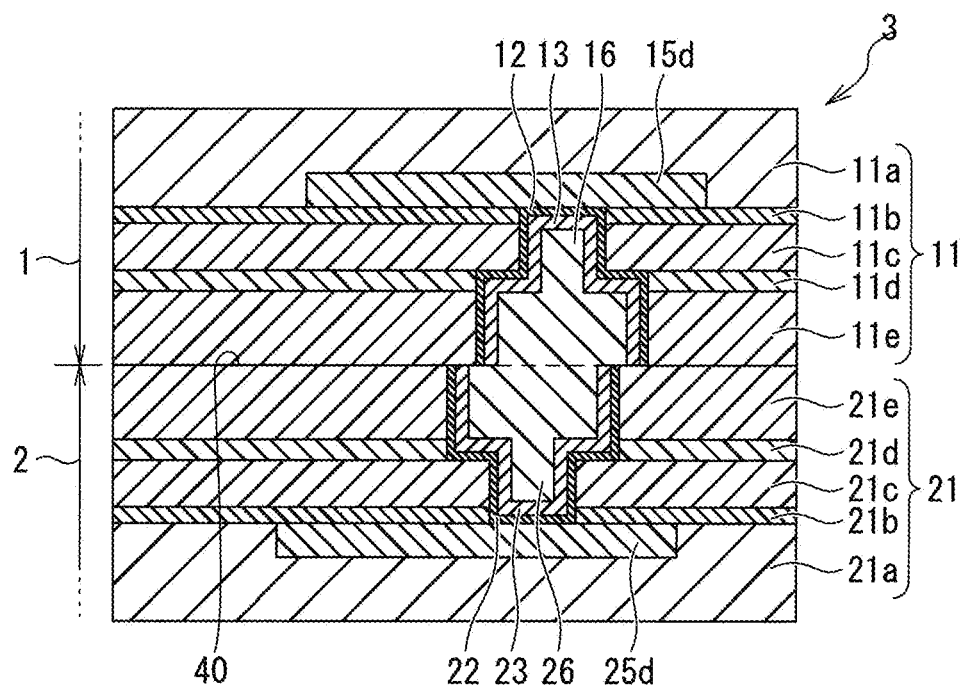
FIG. 15 is a cross-sectional view depicting a modified example of a lamination chip according to Embodiment 1.

In the present embodiment, slight misalignment between the pixel chip 1 and the logic chip 2 is accepted. Slight misalignment may be caused by a manufacturing variation. FIG. 15 is a cross-sectional view depicting a modified example of the lamination chip according to Embodiment 1. As depicted in FIG. 15, slight misalignment may occur between the first electrode section 16 of the pixel chip 1 and the second electrode section 26 of the logic chip 2 due to a manufacturing variation. Even in such a case, a sufficient bonding area provided between the first electrode section 16 and the second electrode section 26 allows effects similar to those of Embodiment 1 described above to be produced. Note that, in FIG. 15, an amount of misalignment is intentionally increased to allow the misalignment to be visually recognized.

Embodiment 2

In Embodiment 1 described above, the barrier layer 12 (or the barrier layer 22) is formed in the trench via provided in the interlayer insulating film by the sputter method. However, the present embodiment of the present disclosure is not limited to this configuration. In the embodiment of the present disclosure, the barrier layer 12 (or the barrier layer 22) need not be formed in the trench via.

Figure 16:
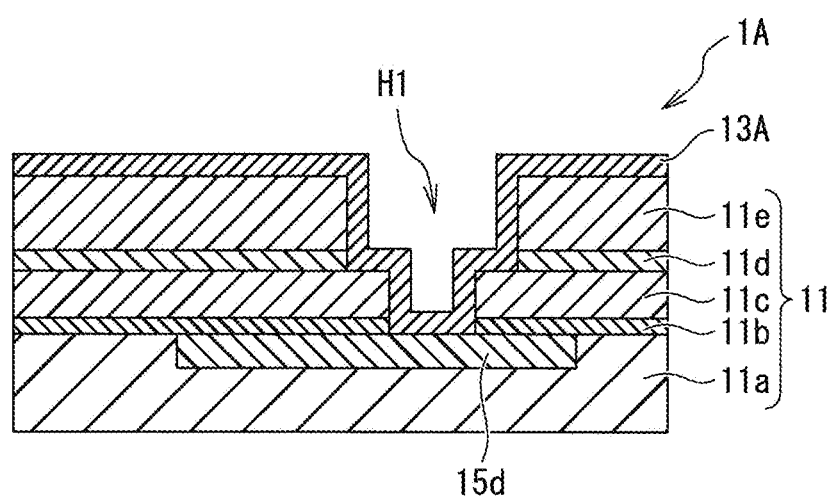
FIG. 16 is a cross-sectional view depicting, in order of steps, a method for manufacturing a lamination chip according to Embodiment 2 of the present disclosure.

FIGS. 16 to 20 are cross-sectional views depicting, in order of steps, a method for manufacturing a lamination chip according to Embodiment 2 of the present disclosure. In FIG. 16, the series of steps through the step of forming the trench via H1 is the same as the corresponding series of steps in Embodiment 1. After the trench via H1 is formed, the manufacturing apparatus forms an alloy seed layer 13A on the first interlayer insulating film 11. A method for forming the alloy seed layer 13A is, for example, the sputter method. The alloy seed layer 13 includes a Cu alloy or an Au alloy, and includes, for example, at least one type of Mn, Al, Sn, or Zn. By way of example, the alloy seed layer 13A includes CuMn, CuAl, AuMn, or AuAl.

Figure 17:
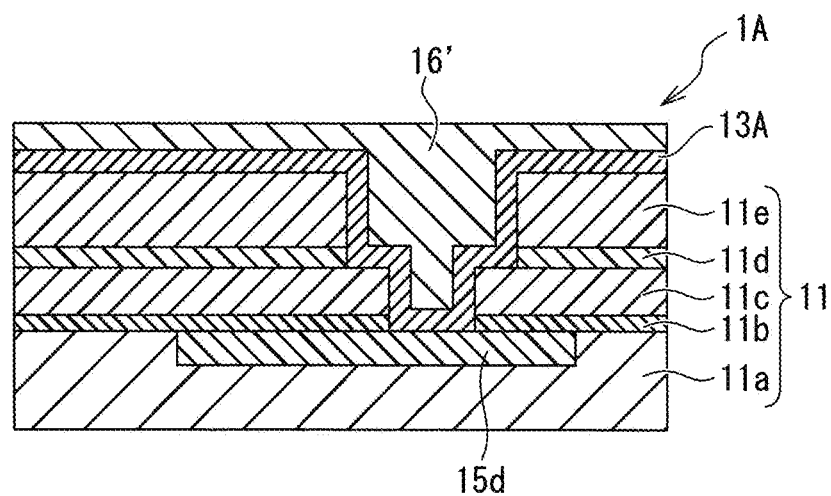
FIG. 17 is a cross-sectional view depicting, in order of steps, the method for manufacturing the lamination chip according to Embodiment 2.
Figure 18:
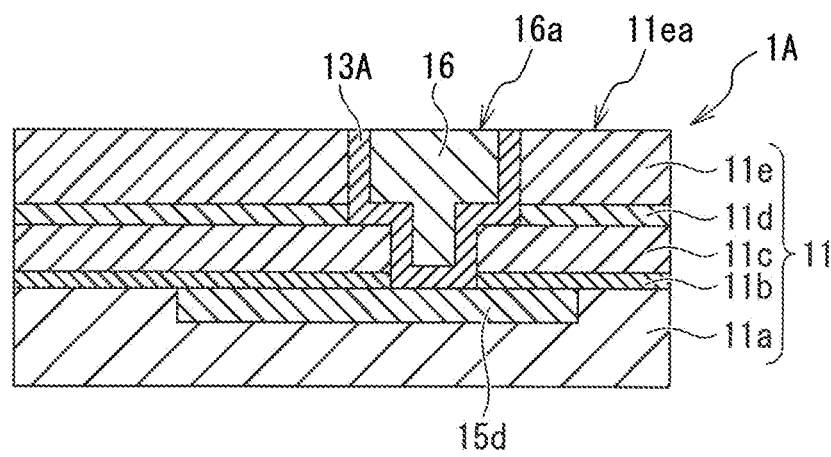
FIG. 18 is a cross-sectional view depicting, in order of steps, the method for manufacturing the lamination chip according to Embodiment 2.

Then, as depicted in FIG. 17, the manufacturing apparatus forms a metal plating layer 16' on the alloy seed layer 13. Then, the manufacturing apparatus applies CMP treatment to the metal plating layer 16' and the alloy seed layer 13 located below the metal plating layer 16' to flatten these layers. As depicted in FIG. 18, the CMP treatment is performed until the front surface (in FIG. 18, the upper surface) 11ea of the fifth insulating film 11e is exposed. Thus, the metal plating layer 16' and the alloy seed layer 13 are removed from the front surface 11ea of the fifth insulating film 11e and are left only in the trench via H1. The metal plating layer 16' forms the first electrode section 16.

Figure 19:
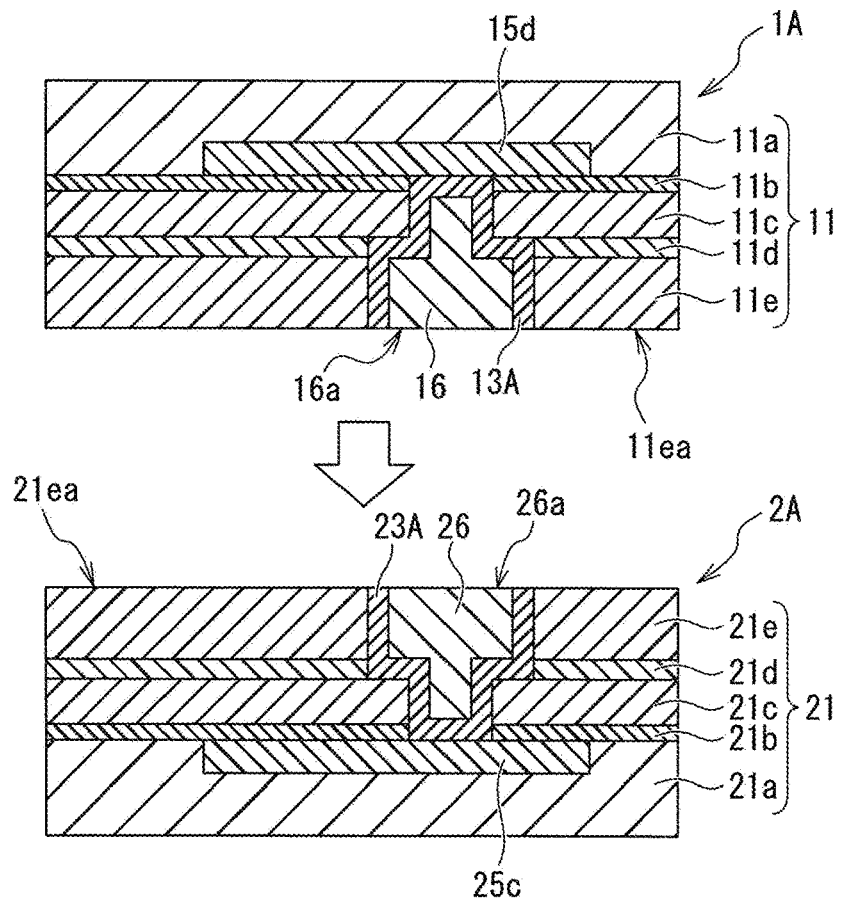
FIG. 19 is a cross-sectional view depicting, in order of steps, the method for manufacturing the lamination chip according to Embodiment 2.

The manufacturing apparatus forms a logic chip 2A depicted in FIG. 19 in parallel with formation of a pixel chip 1A or before or after the formation. The manufacturing apparatus forms the second electrode section 26 of the logic chip 2A using the dual damascene method, as is the case with the first electrode section 16 of the pixel chip 1A.

Figure 20:
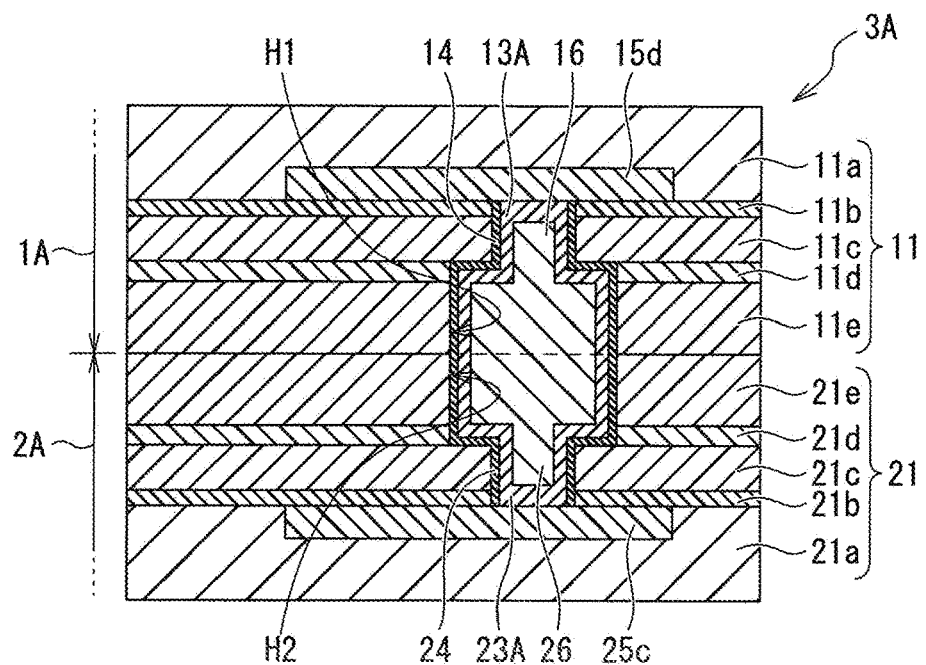
FIG. 20 is a cross-sectional view depicting, in order of steps, the method for manufacturing the lamination chip according to Embodiment 2.

After the pixel chip 1A and the logic chip 2A are prepared, the manufacturing apparatus places the first electrode section 16 of the pixel chip 1A to face the second electrode section 26 of the logic chip 2A as depicted in FIG. 19. Then, the manufacturing apparatus brings the pixel chip 1A and the logic chip 2A into close contact with each other and applies thermal treatment to the chips. Accordingly, as illustrated in FIG. 20, the first electrode section 16 and the second electrode section 26 are bonded and integrated together to form a lamination chip 3A.

Figure 21:
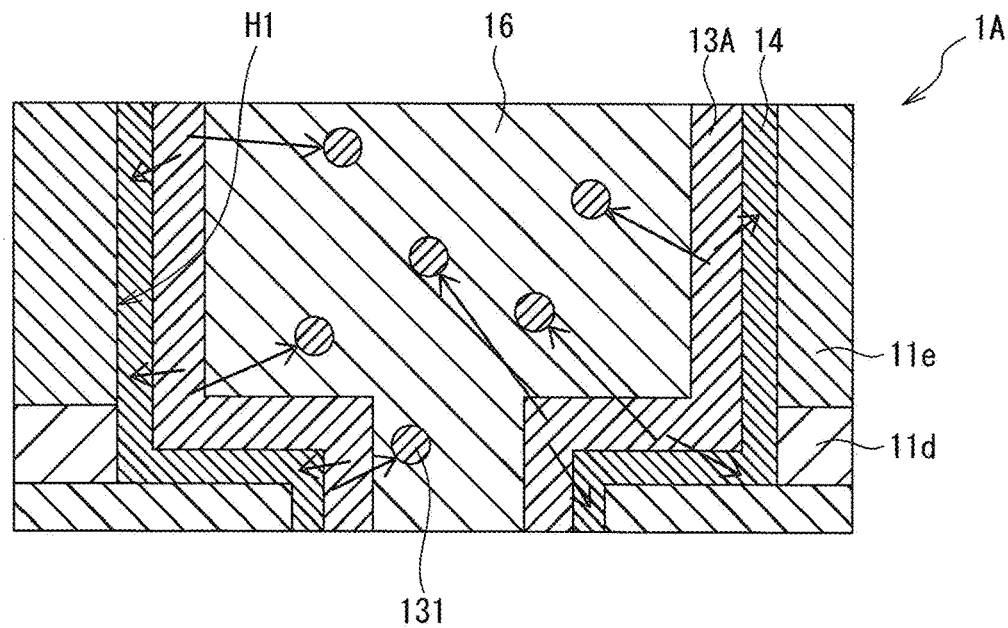
FIG. 21 is a cross-sectional view schematically depicting diffusion of impurities from the alloy seed layer to the first electrode section and a first interlayer insulating film in a pixel chip according to Embodiment 2.

FIG. 21 is a cross-sectional view schematically depicting diffusion of the impurities from the alloy seed layer to the first electrode section and the interlayer insulating film in the pixel chip according to Embodiment 2. As is the case with Embodiment 1, in Embodiment 2, the thermal treatment bonding the first electrode section 16 to the second electrode section 26 diffuses the impurities 131 such as Mn, Al, Sn, or Zn from an alloy seed layer 13A to the first electrode section 16, and the first electrode section 16 changes to an alloy containing the impurities 131.

Additionally, in Embodiment 2, the barrier layer 12 (see FIG. 11) is not provided between the alloy seed layer 13A and the first interlayer insulating film 11. Thus, the impurities 131 also diffuse from the alloy seed layer 13A to the first interlayer insulating film 11. Accordingly, as depicted in FIG. 20 and FIG. 21, the impurities 131 are segregated to a portion of the first interlayer insulating film 11 that comes into contact with the alloy seed layer 13A, forming a segregation layer 14 containing the impurities 131. In Embodiment 2, the segregation layer 14 functions as a barrier layer preventing the material included in the first electrode section 16 from diffusing around.

Similarly, in the logic chip 2A as well, the impurities such as Mn, Al, Sn, or Zn thermally diffuse from the alloy seed layer 23A to the second electrode section 26. Accordingly, the second electrode section 26 also changes to an alloy containing the impurities 131. Additionally, the impurities are segregated to a portion of the second interlayer insulating film 21 that comes into contact with the alloy seed layer 23A, forming a segregation layer 24 (see FIG. 20) containing the impurities. In Embodiment 2, the segregation layer 24 functions as a barrier layer preventing the material included in the second electrode section 26 from diffusing around.

In Embodiment 2 as well, the coefficient of thermal expansion of the first electrode section 16 is larger than the coefficient of thermal expansion of the interconnects 15d. The first electrode section 16 thermally expands more significantly than the interconnects 15d. Additionally, the coefficient of thermal expansion of the second electrode section 26 is larger than the coefficient of thermal expansion of the interconnects 25c. The second electrode section 26 thermally expands more significantly than the interconnects 25c. Thus, even in a case where depression such as dishing occurs in the front surfaces 16a and 26a of the first electrode section 16 and the second electrode section 26, the bondability (for example, the bonding strength) between the first electrode section 16 and the second electrode section 26 can be improved.

Embodiment 3

In Embodiment 1 described above, the aspect has been described in which the impurities diffuse from the alloy seed layer 13 to the first electrode section 16, which is thus alloyed. Additionally, in the above description, the impurities diffuse from the alloy seed layer 23 to the second electrode section 26, which is thus alloyed. However, in the embodiment of the present disclosure, the process of alloying the first electrode section 16 and the second electrode section 26 is not limited to the process described above.

Figure 22:
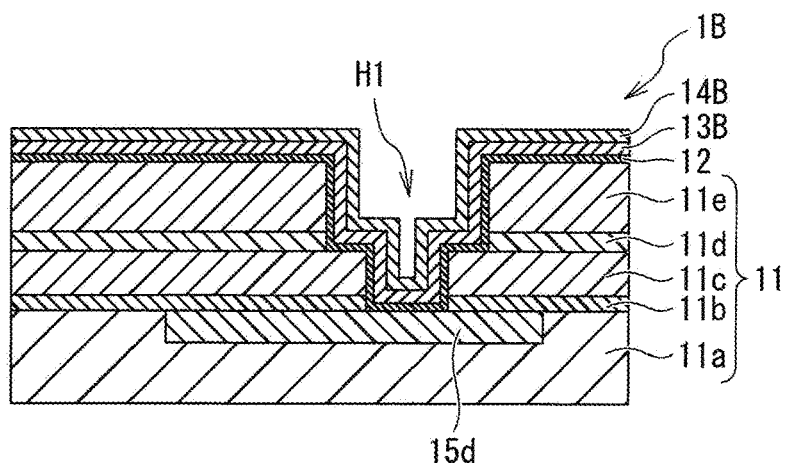
FIG. 22 is a cross-sectional view depicting, in order of steps, a method for manufacturing a lamination chip according to Embodiment 3 of the present disclosure.

FIGS. 22 to 26 are cross-sectional views depicting, in order of steps, a method for manufacturing a lamination chip according to Embodiment 3 of the present disclosure. In FIG. 22, the series of steps through the step of forming the barrier layer 12 is the same as the corresponding series of steps in Embodiment 1. After the barrier layer 12 is formed, the manufacturing apparatus forms a seed layer 13B on the first interlayer insulating film 11. A method for forming the seed layer 13B is, for example, the sputter method. The seed layer 13B includes high-purity Cu (or Au) containing no impurities such as Mn, Al, Sn, or Zn.

Then, the manufacturing apparatus forms an impurities layer 14B on the seed layer 13B. The impurities layer 14B is a conductive layer containing impurities such as Mn, Al, Sn, or Zn. Examples of the impurities layer 14B include silver (Ag) and lead (Pb).

Figure 23:
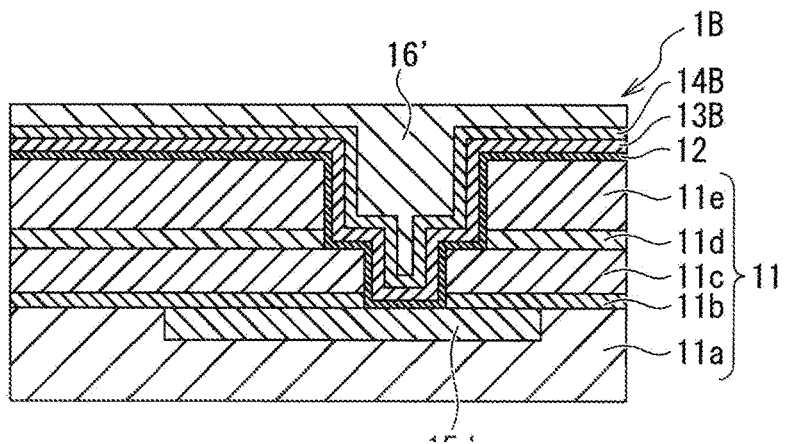
FIG. 23 is a cross-sectional view depicting, in order of steps, the method for manufacturing the lamination chip according to Embodiment 3.
Figure 24:
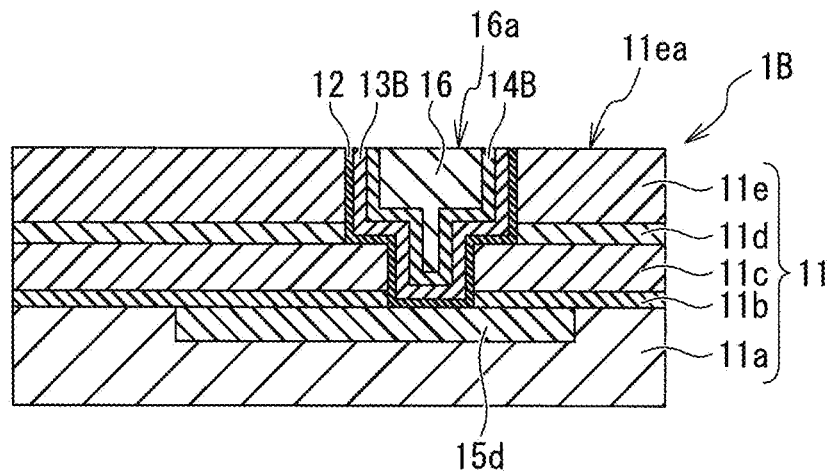
FIG. 24 is a cross-sectional view depicting, in order of steps, the method for manufacturing the lamination chip according to Embodiment 3.

Then, as depicted in FIG. 23, the manufacturing apparatus forms the metal plating layer 16' on the impurities layer 14B. Then, the manufacturing apparatus executes CMP treatment on the metal plating layer 16' and the impurities layer 14B, the seed layer 13B, and the barrier layer 12 located below the metal plating layer 16' to flatten these layers. As illustrated in FIG. 24, the manufacturing apparatus executes the CMP treatment until the front surface (in FIG. 24, the upper surface) 11ea of the fifth insulating film 11e is exposed. Accordingly, the metal plating layer 16', the impurities layer 14B, the seed layer 13B, and the barrier layer 12 are removed from the front surface 11ea of the firth insulating film 11e, and are left only in the trench via H1. The metal plating layer 16' forms the first electrode section 16.

Figure 25:
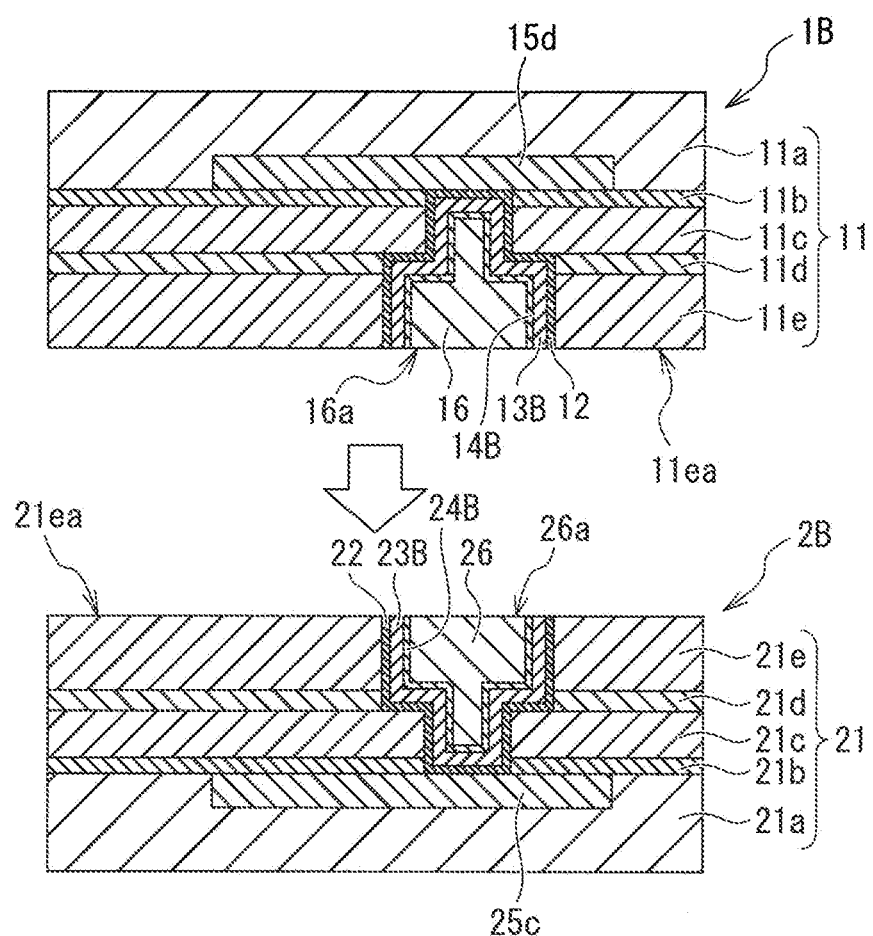
FIG. 25 is a cross-sectional view depicting, in order of steps, the method for manufacturing the lamination chip according to Embodiment 3.

The manufacturing apparatus forms a logic chip 2B depicted in FIG. 25 in parallel with formation of a pixel chip 1B or before or after the formation. The manufacturing apparatus forms the second electrode section 26 of the logic chip 2B using the dual damascene method, as is the case with the first electrode section 16 of the pixel chip 1B.

Figure 26:
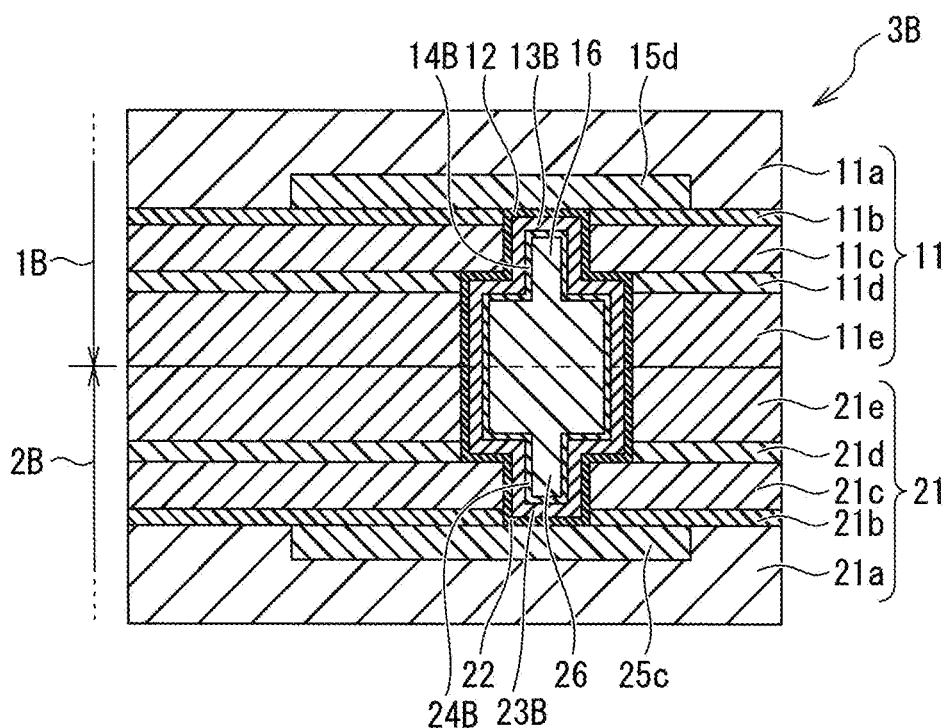
FIG. 26 is a cross-sectional view depicting, in order of steps, the method for manufacturing the lamination chip according to Embodiment 3.

After the pixel chip 1B and the logic chip 2B are prepared, the manufacturing apparatus places the first electrode section 16 of the pixel chip 1B to face the second electrode section 26 of the logic chip 2B as depicted in FIG. 25. Then, the manufacturing apparatus brings the pixel chip 1B and the logic chip 2B into close contact with each other and applies thermal treatment to the chips. Accordingly, as illustrated in FIG. 26, the first electrode section 16 and the second electrode section 26 are bonded and integrated together to form a lamination chip 3B.

Figure 27:
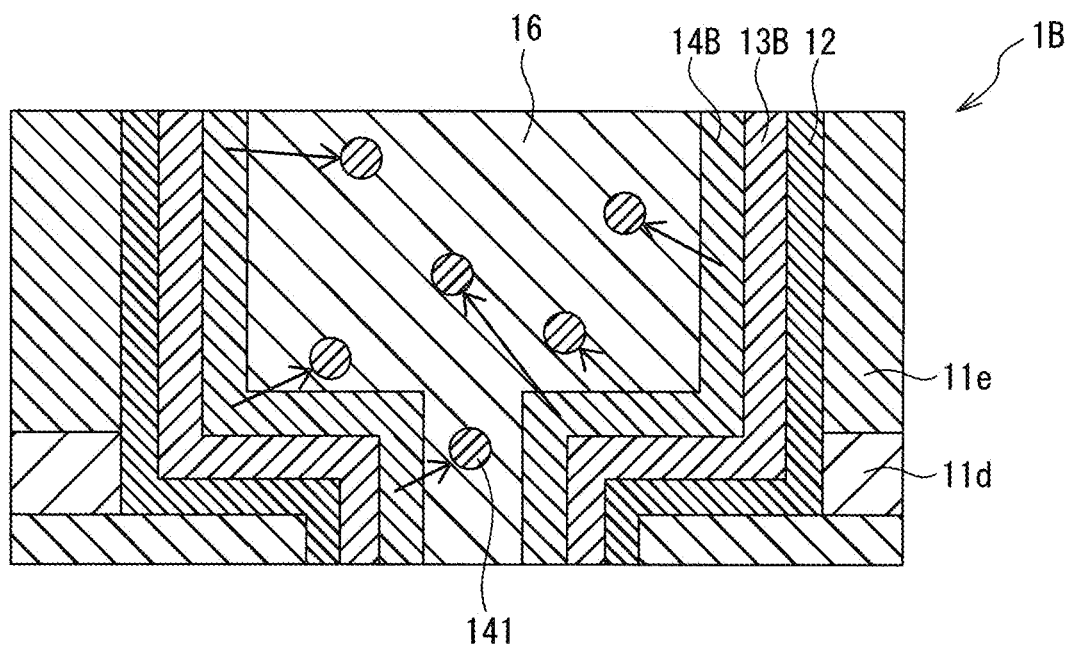
FIG. 27 is a cross-sectional view schematically depicting diffusion of impurities from an impurities layer to the first electrode section in a pixel chip according to Embodiment 3.

FIG. 27 is a cross-sectional view schematically depicting diffusion of the impurities from the impurities layer to the first electrode section in the pixel chip according to Embodiment 3. In Embodiment 3, the thermal treatment bonding the first electrode section 16 to the second electrode section 26 diffuses impurities 141 such as Mn, Al, Sn, or Zn from the impurities layer 14B to the first electrode section 16 as illustrated in FIG. 27, and the first electrode section 16 changes to an alloy containing the impurities 141. Similarly, in the logic chip 2A as well, impurities such as Mn, Al, Sn, or Zn diffuse from an impurities layer 24B on a seed layer 23B to the second electrode section 26, and the second electrode section 26 changes to an alloy containing the impurities.

In Embodiment 3 as well, the coefficient of thermal expansion of the first electrode section 16 is larger than the coefficient of thermal expansion of the interconnects 15d. The first electrode section 16 thermally expands more significantly than the interconnects 15d. Additionally, the coefficient of thermal expansion of the second electrode section 26 is larger than the coefficient of thermal expansion of the interconnects 25c. The second electrode section 26 thermally expands more significantly than the interconnects 25c. Thus, even in a case where depression such as dishing occurs in the front surfaces 16a and 26a of the first electrode section 16 and the second electrode section 26, the bondability (for example, the bonding strength) between the first electrode section 16 and the second electrode section 26 can be improved.

Embodiment 4

As described above in Embodiment 1, at the beginning of formation of the metal plating layer 16', the metal plating layer 16' includes high-purity Cu (or Au) containing no impurities such as Mn, Al, Sn, or Zn. However, the embodiment of the present disclosure is not limited to this configuration. The metal plating layer 16' may be in an alloy form containing impurities at the beginning of formation.

Figure 28:
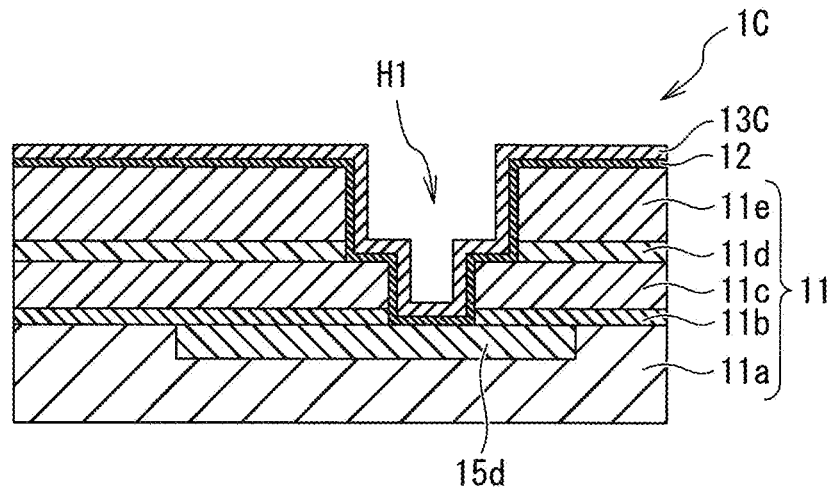
FIG. 28 is a cross-sectional view depicting, in order of steps, a method for manufacturing a lamination chip according to Embodiment 4 of the present disclosure.
Figure 29:
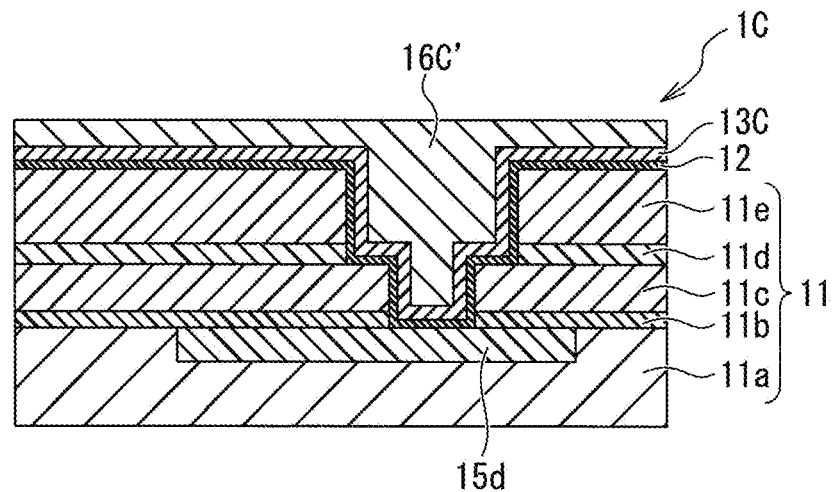
FIG. 29 is a cross-sectional view depicting, in order of steps, the method for manufacturing the lamination chip according to Embodiment 4 of the present disclosure.

FIGS. 28 to 32 are cross-sectional views depicting, in order of steps, a method for manufacturing a lamination chip according to Embodiment 4 of the present disclosure. In FIG. 28, the series of steps through the step of forming the barrier layer 12 is the same as the corresponding series of steps in Embodiment 1. After the barrier layer 12 is formed, the manufacturing apparatus forms a seed layer 13C on the first interlayer insulating film 11. A method for forming the seed layer 13C is, for example, the sputter method. The seed layer 13C includes high-purity Cu (or Au) containing no impurities such as Mn, Al, Sn, or Zn.

Then, the manufacturing apparatus forms a metal plating layer 16C' on the seed layer 13C. The manufacturing apparatus forms the metal plating layer 16C' using an alloy plating solution containing impurities such as Mn, Al, Sn, or Zn in addition to Cu (or Au). Accordingly, a Cu alloy (or an Au alloy) containing impurities such as Mn, Al, Sn, or Zn is formed as the metal plating layer 16C'. The metal plating layer 16C' is in an alloy form containing the impurities at the beginning of formation.

Figure 30:
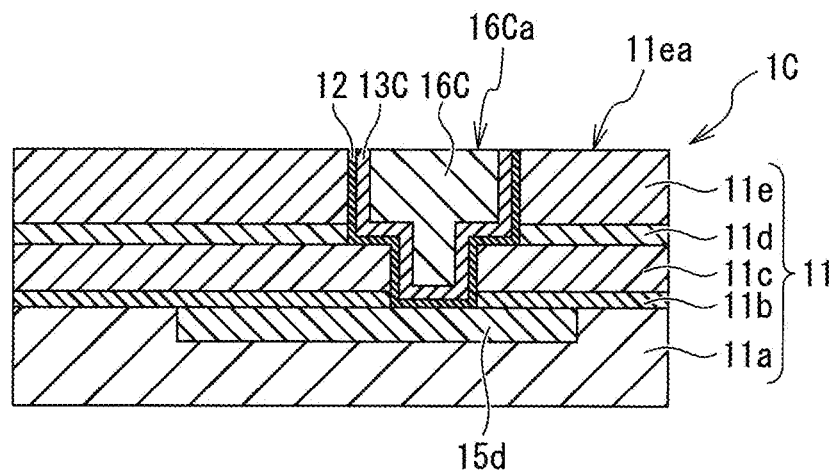
FIG. 30 is a cross-sectional view depicting, in order of steps, the method for manufacturing the lamination chip according to Embodiment 4.

Then, the manufacturing apparatus executes CMP treatment on the metal plating layer 16C' and the seed layer 13C located below the metal plating layer 16C' to flatten these layers. As illustrated in FIG. 30, the manufacturing apparatus executes the CMP treatment until the front surface (in FIG. 29, the upper surface) 11ea of the fifth insulating film 11e is exposed. Accordingly, the metal plating layer 16C' and the seed layer 13C are removed from the front surface 11ea of the firth insulating film 11e, and are left only in the trench via H1. The metal plating layer 16C' in an alloy state containing the impurities forms a first electrode section 16C.

Figure 31:
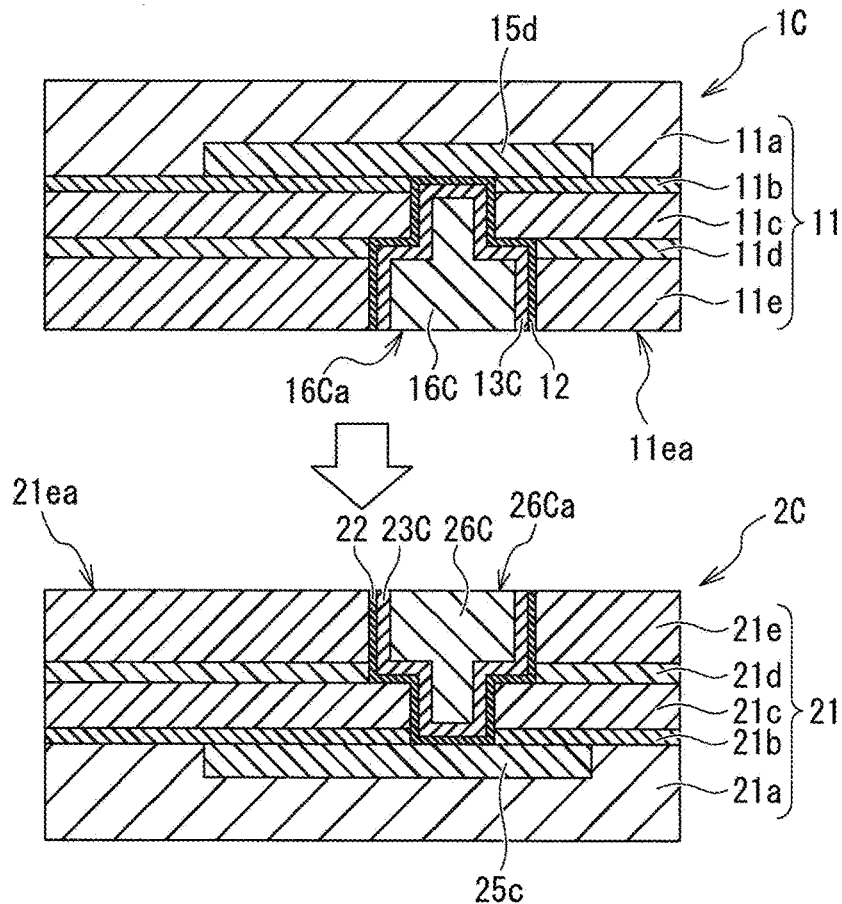
FIG. 31 is a cross-sectional view depicting, in order of steps, the method for manufacturing the lamination chip according to Embodiment 4.

The manufacturing apparatus forms a logic chip 2C depicted in FIG. 31 in parallel with formation of a pixel chip 1C or before or after the formation. The manufacturing apparatus also forms a second electrode section 26C of the logic chip 2C using the dual damascene method, as is the case with the first electrode section 16C of the pixel chip 1C. As is the case with the first electrode section 16C, the manufacturing apparatus forms the second electrode section 26C and Cu (or Au) using an alloy plating solution containing the impurities such as Mn, Al, Sn, or Zn.

Figure 32:
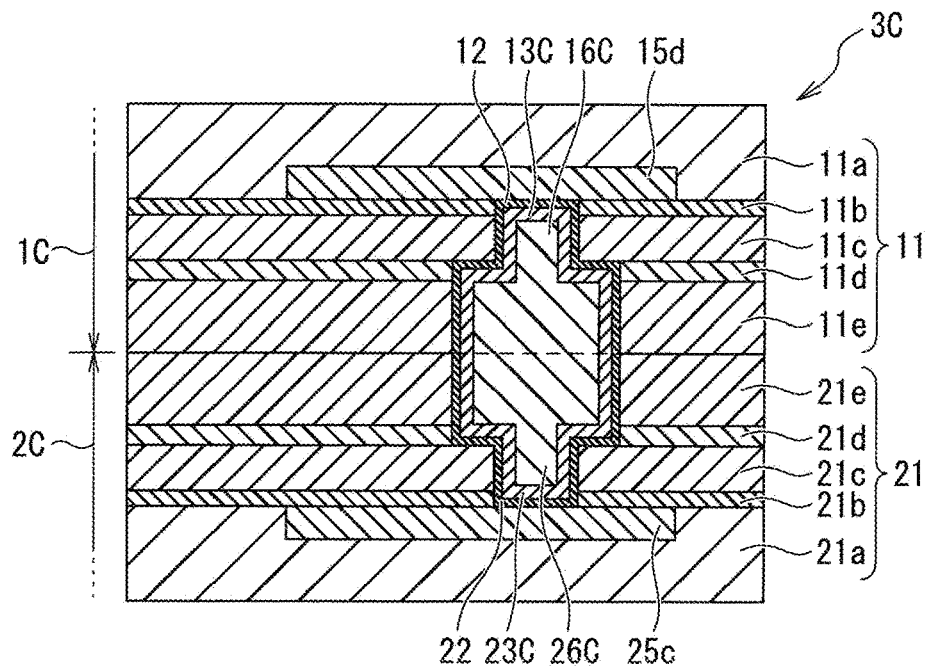
FIG. 32 is a cross-sectional view depicting, in order of steps, the method for manufacturing the lamination chip according to Embodiment 4.

After the pixel chip 1C and the logic chip 2C are prepared, the manufacturing apparatus places the first electrode section 16 of the pixel chip 1B to face the second electrode section 26 of the logic chip 2B as depicted in FIG. 31. Then, the manufacturing apparatus brings the pixel chip 1C and the logic chip 2C into close contact with each other and applies thermal treatment to the chips. Accordingly, as illustrated in FIG. 32, the first electrode section 16 and the second electrode section 26 are bonded and integrated together to form a lamination chip 3C.

Figure 33:
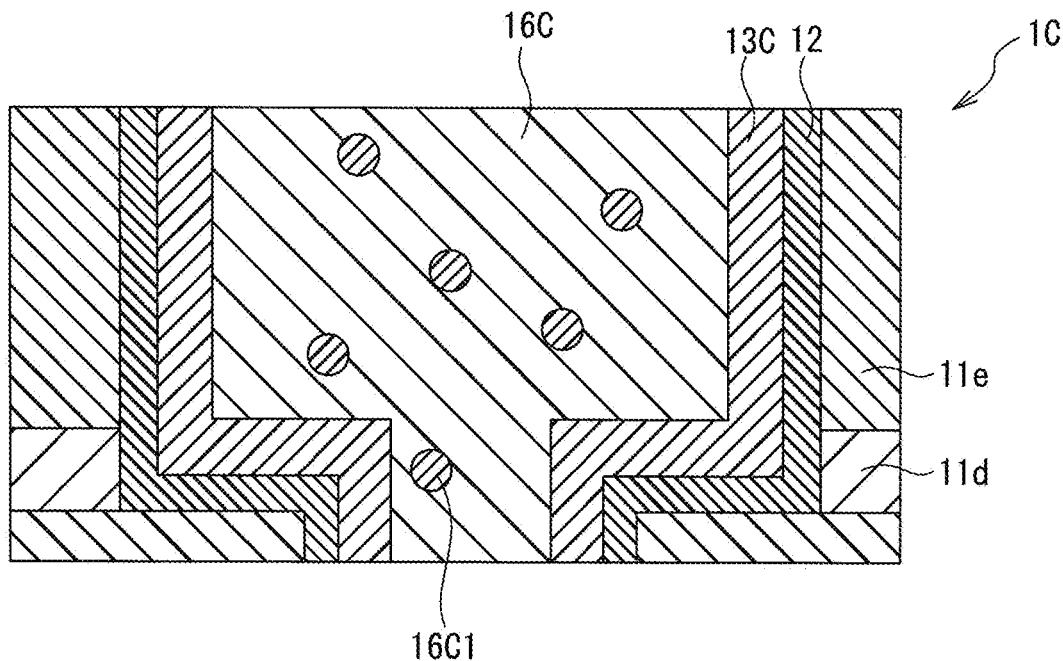
FIG. 33 is a cross-sectional view schematically illustrating that impurities are included in the first electrode section in a pixel chip according to Embodiment 4.

FIG. 33 is a cross-sectional view schematically depicting the first electrode section containing impurities in the pixel chip according to Embodiment 4. As depicted in FIG. 33, the first electrode section 16C contains impurities 161. The impurities 161 are, for example, Mn, Al, Sn, or Zn. The seed layer 13C and the barrier layer 12 need not contain the impurities 161. Similarly, in the logic chip 2A as well, the second electrode section 26C contains impurities such as Mn, Al, Sn, or Zn. The seed layer 23C and the barrier layer 22 (see FIG. 32) need not contain the impurities 161.

In Embodiment 4 as well, the coefficient of thermal expansion of the first electrode section 16C is larger than the coefficient of thermal expansion of the interconnects 15d. The first electrode section 16C thermally expands more significantly than the interconnects 15d. Additionally, the coefficient of thermal expansion of the second electrode section 26C is larger than the coefficient of thermal expansion of the interconnects 25c. The second electrode section 26C thermally expands more significantly than the interconnects 25c. Thus, even in a case where depression such as dishing occurs in the front surfaces 16a and 26a of the first electrode section 16C and the second electrode section 26C, the bondability (for example, the bonding strength) between the first electrode section 16C and the second electrode section 26C can be improved.

Embodiment 5

As described above in Embodiment 1, the first electrode section 16 of the pixel chip 1 and the second electrode section 26 of the logic chip 2 are each formed by the dual damascene method. However, the embodiment of the present disclosure is not limited to this configuration. At least one of the first electrode section 16 or the second electrode section 26 may be formed by the single damascene method.

Figure 34:
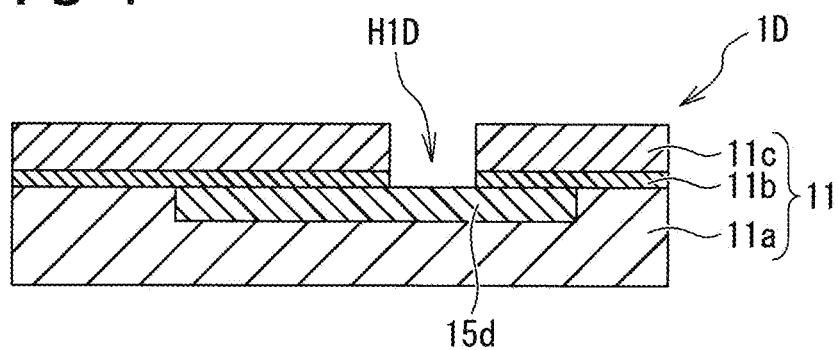
FIG. 34 is a cross-sectional view depicting, in order of steps, a method for manufacturing a lamination chip according to Embodiment 5 of the present disclosure.

FIGS. 34 to 39 are cross-sectional views depicting, in order of steps, a method for manufacturing a lamination chip according to Embodiment 5 of the present disclosure. As illustrated in FIGS. 34 to 37, the manufacturing apparatus forms the first electrode section using the single damascene method. For example, as depicted in FIG. 34, the manufacturing apparatus etches the third insulating film 11c included in the first interlayer insulating film 11 and the second insulating film 11b located below the third insulating film 11c to form a through-hole H1D penetrating the third insulating film 11c and the second insulating film 11b. The through-hole H1D is a trench (interconnect groove) or a via hole (connection hole).

Figure 35:
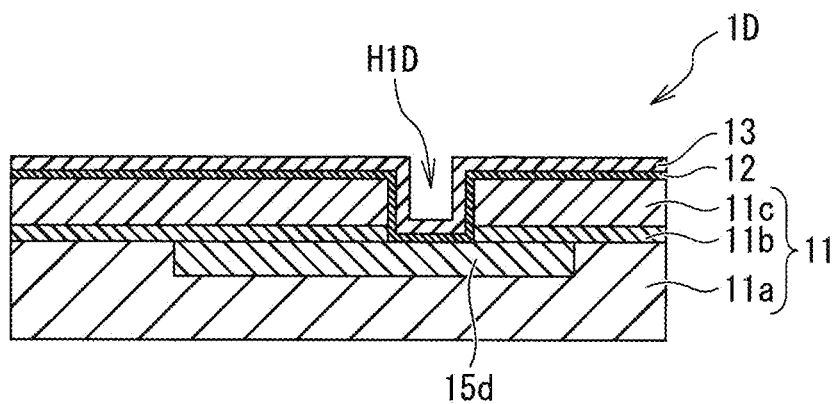
FIG. 35 is a cross-sectional view depicting, in order of steps, the method for manufacturing the lamination chip according to Embodiment 5.
Figure 36:
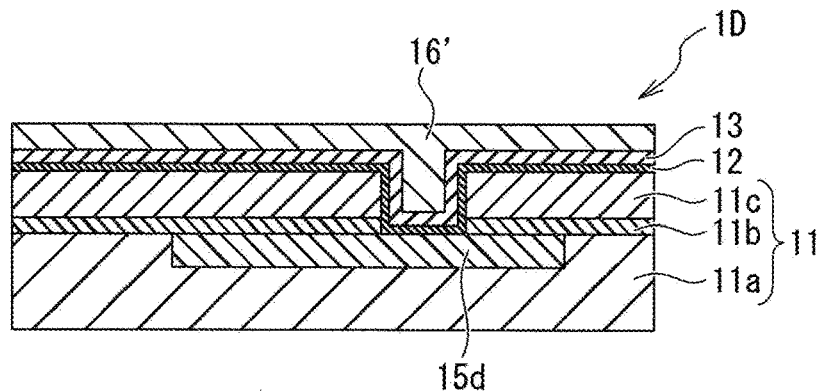
FIG. 36 is a cross-sectional view depicting, in order of steps, the method for manufacturing the lamination chip according to Embodiment 5.
Figure 37:
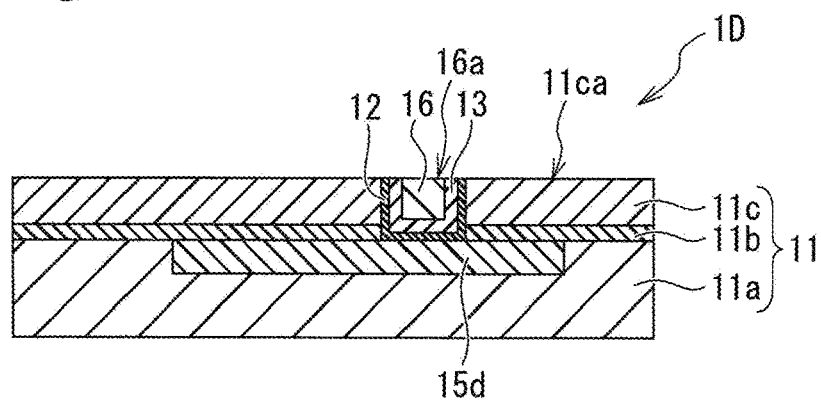
FIG. 37 is a cross-sectional view depicting, in order of steps, the method for manufacturing the lamination chip according to Embodiment 5.

Then, as illustrated in FIG. 35, the manufacturing apparatus sequentially forms the barrier layer 12 and the alloy seed layer 13 on the first interlayer insulating film 11. Then, as depicted in FIG. 36, the manufacturing apparatus forms the metal plating layer 16' on the alloy seed layer 13. Then, the manufacturing apparatus executes CMP treatment on the metal plating layer 16' and the alloy seed layer 13 located below the metal plating layer 16' to flatten these layers. As illustrated in FIG. 37, the manufacturing apparatus executes the CMP treatment until the front surface (in FIG. 18, the upper surface) 11ca of the third insulating film 11c is exposed. Accordingly, the metal plating layer 16', the alloy seed layer 13, and the barrier layer 12 are removed from the third insulating film 11ca, and are left only in the through-hole H1D. The metal plating layer 16' forms the first electrode section 16.

Figure 38:
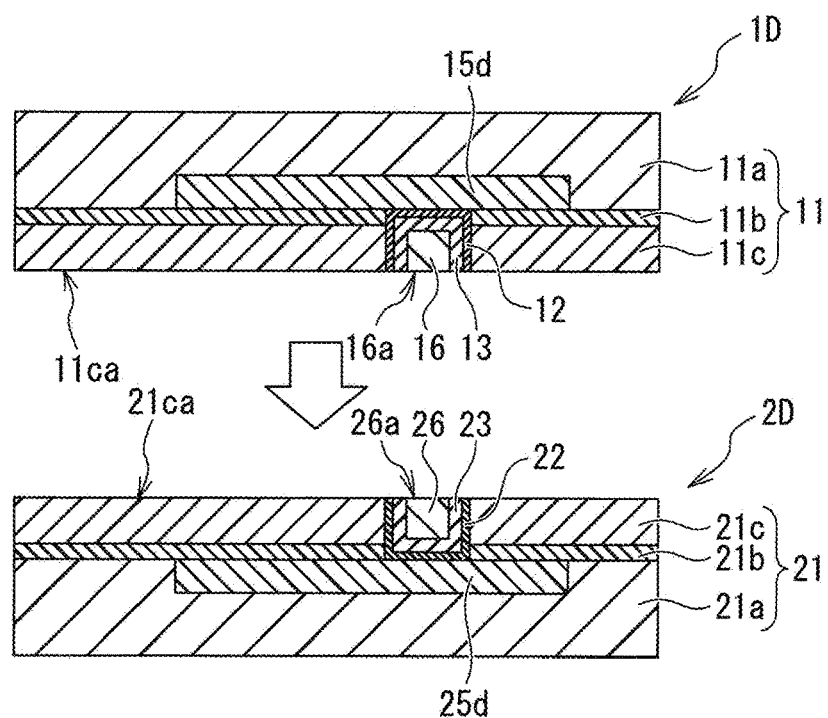
FIG. 38 is a cross-sectional view depicting, in order of steps, the method for manufacturing the lamination chip according to Embodiment 5.

The manufacturing apparatus forms a logic chip 2D depicted in FIG. 38 in parallel with formation of a pixel chip 1D or before or after the formation. The manufacturing apparatus forms the second electrode section 26 of the logic chip 2D using the single damascene method, as is the case with the first electrode section 16 of the pixel chip 1D.

Figure 39:
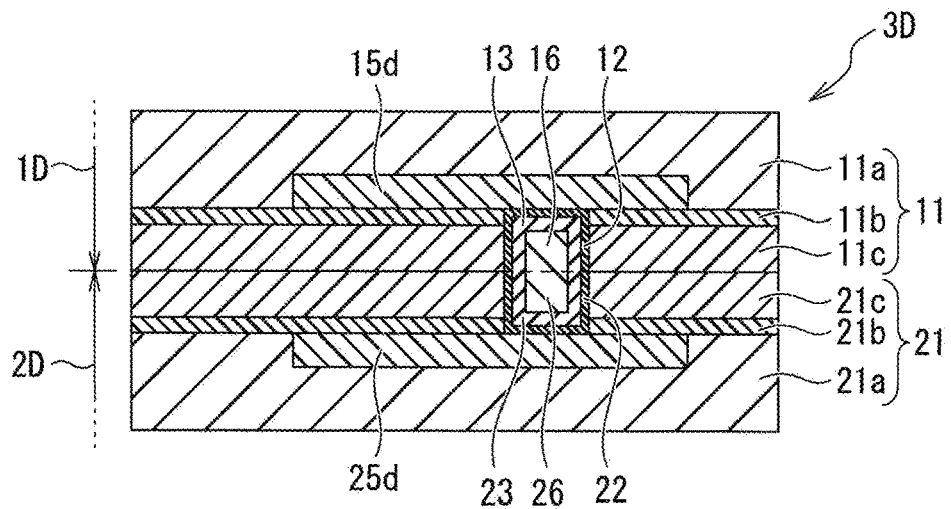
FIG. 39 is a cross-sectional view depicting, in order of steps, the method for manufacturing the lamination chip according to Embodiment 5.

After the pixel chip 1D and the logic chip 2D are prepared, the manufacturing apparatus places the first electrode section 16 of the pixel chip 1D to face the second electrode section 26 of the logic chip 2D as illustrated in FIG. 38. Then, the manufacturing apparatus brings the pixel chip 1D and the logic chip 2D into close contact with each other and applies thermal treatment to the chips. Accordingly, as illustrated in FIG. 39, the first electrode section 16 and the second electrode section 26 are bonded and integrated together to form a lamination chip 3D.

In Embodiment 5 as well, the coefficient of thermal expansion of the first electrode section 16 is larger than the coefficient of thermal expansion of the interconnects 15$d$. The first electrode section 16 thermally expands more significantly than the interconnects 15$d$. Additionally, the coefficient of thermal expansion of the second electrode section 26 is larger than the coefficient of thermal expansion of the interconnects 25$c$. The second electrode section 26 thermally expands more significantly than the interconnects 25$c$. Thus, even in a case where depression such as dishing occurs in the front surfaces 16$a$ and 26$a$ of the first electrode section 16 and the second electrode section 26, the bondability (for example, the bonding strength) between the first electrode section 16 and the second electrode section 26 can be improved.

Embodiment 6

As described above in Embodiment 1, the interconnects 15$d$ and the interconnects 25$c$ located at an outer peripheral portion of the lamination chip 3 are electrically connected together via the first electrode section 16 and the second electrode section 26. However, in the embodiment of the present disclosure, the position of the interconnects electrically connected together via the first electrode section 16 and the second electrode section 26 is not limited to the outer peripheral portion of the lamination chip 3.

Figure 40:
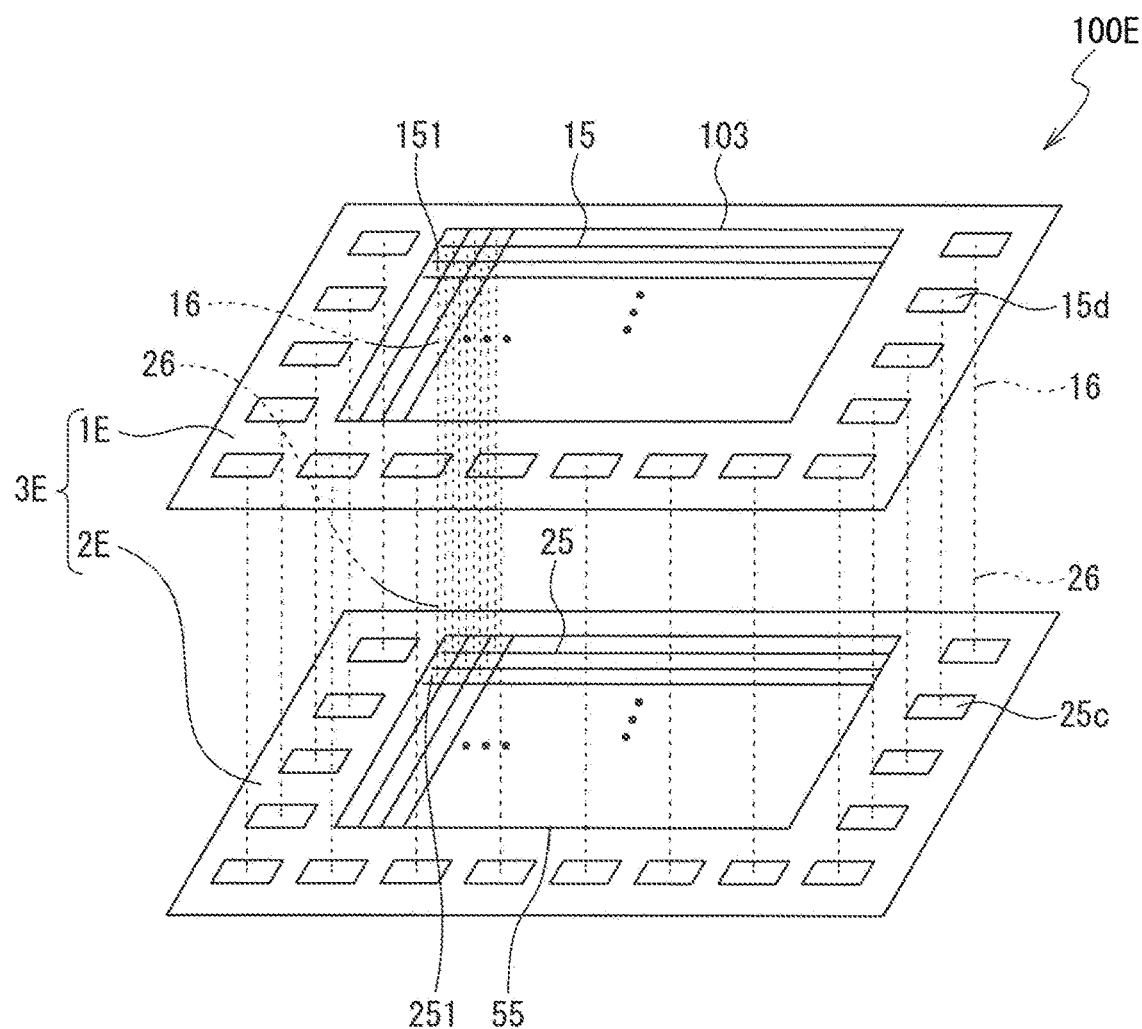
FIG. 40 is a schematic diagram depicting a configuration example of a solid-state image pickup apparatus according to Embodiment 6 of the present disclosure.

FIG. 40 is a schematic diagram depicting a configuration example of a solid-state image pickup apparatus according to Embodiment 6 of the present disclosure. As illustrated in FIG. 40, in a solid-state image pickup apparatus 100E according to Embodiment 6, the interconnects 15$d$ and the interconnects 25$c$ located at an outer peripheral portion of a lamination chip 3E are electrically connected together via the first electrode section 16 and the second electrode section 26.

Additionally, in the solid-state image pickup apparatus 100E, interconnects 151 and interconnects 251 located in a central portion of the lamination chip 3E are electrically connected together via the first electrode section 16 and the second electrode section 26. For example, the interconnects 151 are provided in the pixel region 103 of a pixel chip 1E. The interconnects 151 are multilayer interconnects each including metals M1 to M4 (see FIG. 3). The interconnects 151 are used as signal lines on the pixel chip 1E side for connecting each of the plurality of pixels 102 (see FIG. 3) to the logic circuit 55. The interconnects 251 are provided in the logic circuit 55 of a logic chip 2E. The interconnects 251 are multilayer interconnects each including metals M11 to M13 (see FIG. 3). The interconnects 251 are used as signal lines on the logic chip 2E side for connecting each of the plurality of pixels 102 to the logic circuit 55.

Such a configuration eliminates the need to route, via the outer peripheral portion of the lamination chip 3, the signal lines connecting each of the plurality of pixels 102 to the logic circuit 55. Instead of being routed via the outer peripheral portion of the lamination chip 3, the signal lines connect, at the central portion of the lamination chip 3, each of the pixels 102 and the logic circuit 55 in the up-down direction. This allows the signal lines connecting the pixels 102 and the logic circuit 55 to extend in a thickness direction of the solid-state image pickup apparatus 100E, enabling a reduction in the length of the signal lines. This allows contribution to increasing the speed of signal processing and reducing the size of chips. Note that the interconnects 151 may be used as power supply lines on the pixel chip 1E side, whereas the interconnects 251 may be used as power supply lines on the logic chip 2E side.

Note that, in the solid-state image pickup apparatus 100E, the electric connection between each interconnect 151 and the corresponding interconnect 251 may be established via the interconnect upper portion 91 and the interconnect lower portion 92 depicted in FIG. 14 rather than via the first electrode section 16 and the second electrode section 26. For example, the interconnect 151 may include the interconnect upper portion 91, the interconnect 251 may include the interconnect lower portion 92, and the interconnect upper portion 91 and the interconnect lower portion 92 may be Cu—Cu bonded (or Au—Au bonded) to each other to electrically connect the interconnect 151 and the interconnect 251. Even in such a configuration, the signal lines connecting the pixels 102 and the logic circuit 55 need not be withdrawn to the outer peripheral portion of the lamination chip 3, enabling a reduction in the length of the signal lines. This allows contribution to increasing the speed of signal processing and reducing the size of chips.

Other Embodiments

As described above, the present disclosure has been described in conjunction with the embodiments and the modified examples. However, the descriptions and the drawings forming a part of the disclosure should not be appreciated as limiting the present disclosure. On the basis of the present disclosure, various alternative embodiments, examples, and operational techniques will be clear to a person skilled in the art.

For example, in the present embodiment, the first electrode section need not be an alloy. Even in a case where the first electrode section is not an alloy, effects similar to the effects of Embodiment 1 described above can be produced in a case where the first electrode section has a larger coefficient of thermal expansion than the first interconnect section. Similarly, the second electrode section need not be an alloy. Even in a case where the second electrode section is not an alloy, effects similar to the effects of Embodiment 1 described above can be produced in a case where the second electrode section has a larger coefficient of thermal expansion than the second interconnect section. Examples of materials for the first electrode section and the second electrode section that enable the aspect as described above include Ag, Al, Zn, Sn, indium (In), and Pb.

Additionally, in the present embodiment, the solid-state image pickup apparatus is not limited to the case where the solid-state image pickup apparatus includes the two semiconductor chips illustrated as the pixel chip 1 and the logic chip 2. For example, the solid-state image pickup apparatus can be configured by laminating three or more semiconductor chips together. For example, in the solid-state image pickup apparatus, in addition to the pixel chip 1 and the logic chip 2 described above, a semiconductor chip including a memory element array may be laminated. The solid-state image pickup apparatus according to the present embodiment may be one lamination chip into which three or more semiconductor chips are laminated together.

Additionally, the semiconductor apparatus according to the present disclosure is not limited to the solid-state image pickup apparatus. The semiconductor apparatus according to the present disclosure may be applied to various semiconductor apparatuses such as a storage apparatus using a semiconductor, a display apparatus using a semiconductor, a sensor apparatus using a semiconductor, and a calculation apparatus using a semiconductor.

As described above, needless to say, the present disclosure includes various embodiments and the like not described herein. At least one of various omissions, replacements, or changes of components can be made without departing from the spirits of the embodiments and the modified examples described above. Additionally, the effects described herein are only illustrative and not restrictive, and any other effect may be produced by the present disclosure. The technical range of the present disclosure is defined only by matters specifying the invention according to claims that are appropriate on the basis of the above description.

<Examples of Application to Electronic Equipment>

The technique according to the present disclosure (present technique) can be applied to various products. For example, the technique according to the present disclosure can be applied to various types of electronic equipment such as image pickup apparatuses such as a digital still camera and a digital video camera, cellular phones including an image pickup function, or any other types of equipment including an image pickup function.

Figure 41:
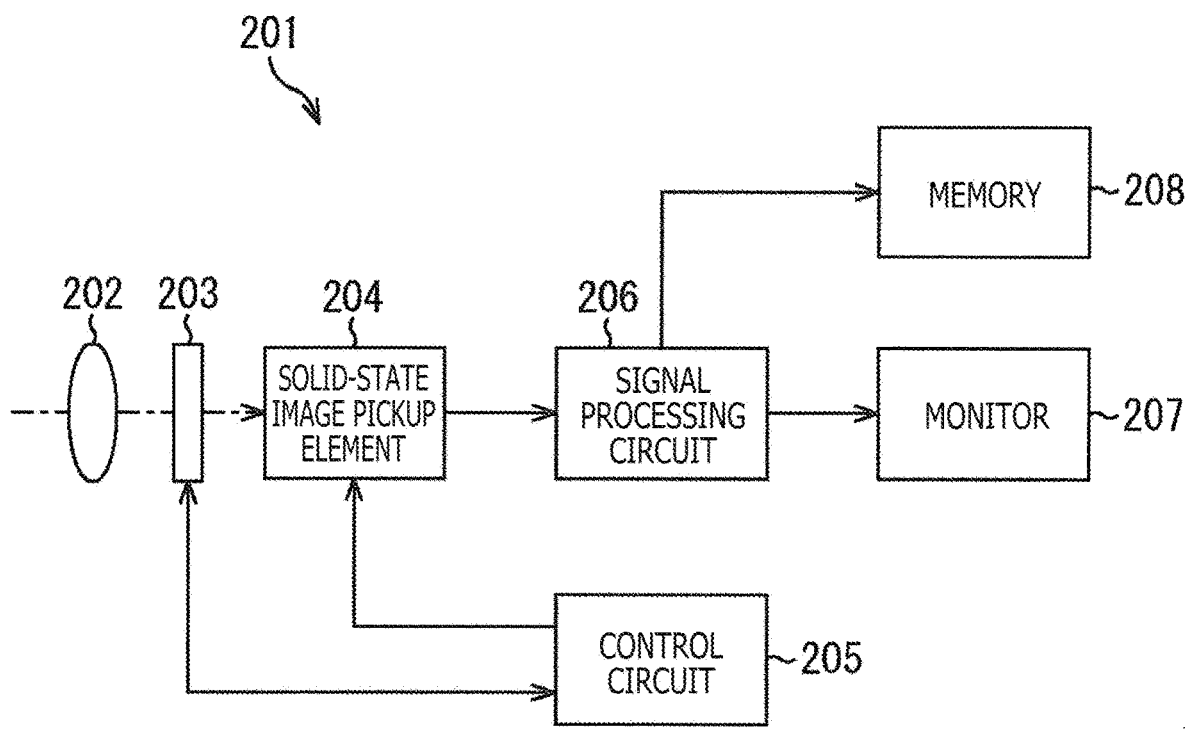
FIG. 41 is a block diagram illustrating a configuration example of an image pickup apparatus used as electronic equipment.

FIG. 41 is a block diagram depicting a configuration example of an image pickup apparatus as electronic equipment to which the present technique may be applied. An image pickup apparatus 201 depicted in FIG. 41 includes an optical system 202, a shutter apparatus 203, a solid-state image pickup element 204, a driving circuit 205, a signal processing circuit 206, a monitor 207, and a memory 208, and can pick up still images and moving images.

The optical system 202 includes one or more lenses and guides light (incident light) from a subject, to the solid-state image pickup element 204, where the light is formed into an image on a light receiving surface of the solid-state image pickup element 204.

The shutter apparatus 203 is disposed between the optical system 202 and the solid-state image pickup element 204, and controls periods of light radiation to the solid-state image pickup element 204 and light shielding in accordance with control of the driving circuit 1005.

The solid-state image pickup element 204 includes a package including the above-described solid-state image pickup element. The solid-state image pickup element 204 accumulates signal charge for a certain period according to light formed into an image on the light receiving surface via the optical system 202 and the shutter apparatus 203. The signal charge accumulated in the solid-state image pickup element 204 is transferred according to driving signals (timing signals) fed from the driving circuit 205.

The driving circuit 205 outputs driving signals controlling a transfer operation of the solid-state image pickup element 204 and a shutter operation of the shutter apparatus 203 to drive the solid-state image pickup element 204 and the shutter apparatus 203.

The signal processing circuit 206 executes various types of signal processing on the signal charge output from the solid-state image pickup element 204. An image (image data) obtained by the signal processing circuit 206 executing the signal processing on the signal charge is fed to and displayed on the monitor 207 or fed to and stored (recorded) in the memory 208.

Also in the image pickup apparatus 201 configured as described above, image pickup with low noise can be realized in all the pixels by employing the solid-state image pickup element 100 or 100E instead of the solid-state image pickup element 204 described above.

<Example of Application to Endoscopic Surgery System>

The technique according to the present disclosure (present technique) can be applied to various products. For example, the technique according to the present disclosure may be applied to an endoscopic surgery system.

Figure 42:
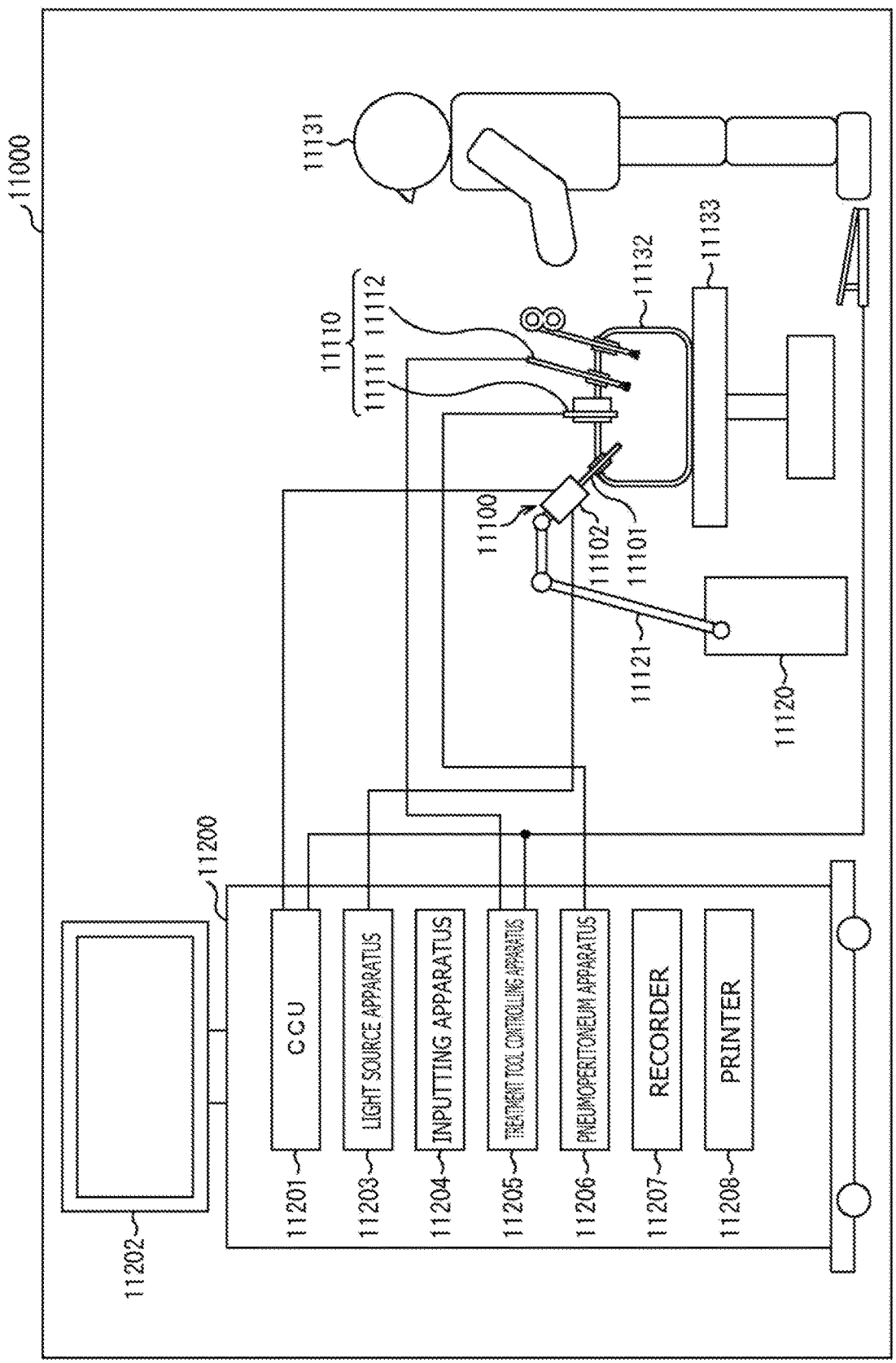
FIG. 42 is a view depicting an example of a schematic configuration of an endoscopic surgery system.

FIG. 42 is a view depicting an example of a schematic configuration of an endoscopic surgery system to which the technology according to an embodiment of the present disclosure (present technology) can be applied.

In FIG. 42, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 43:
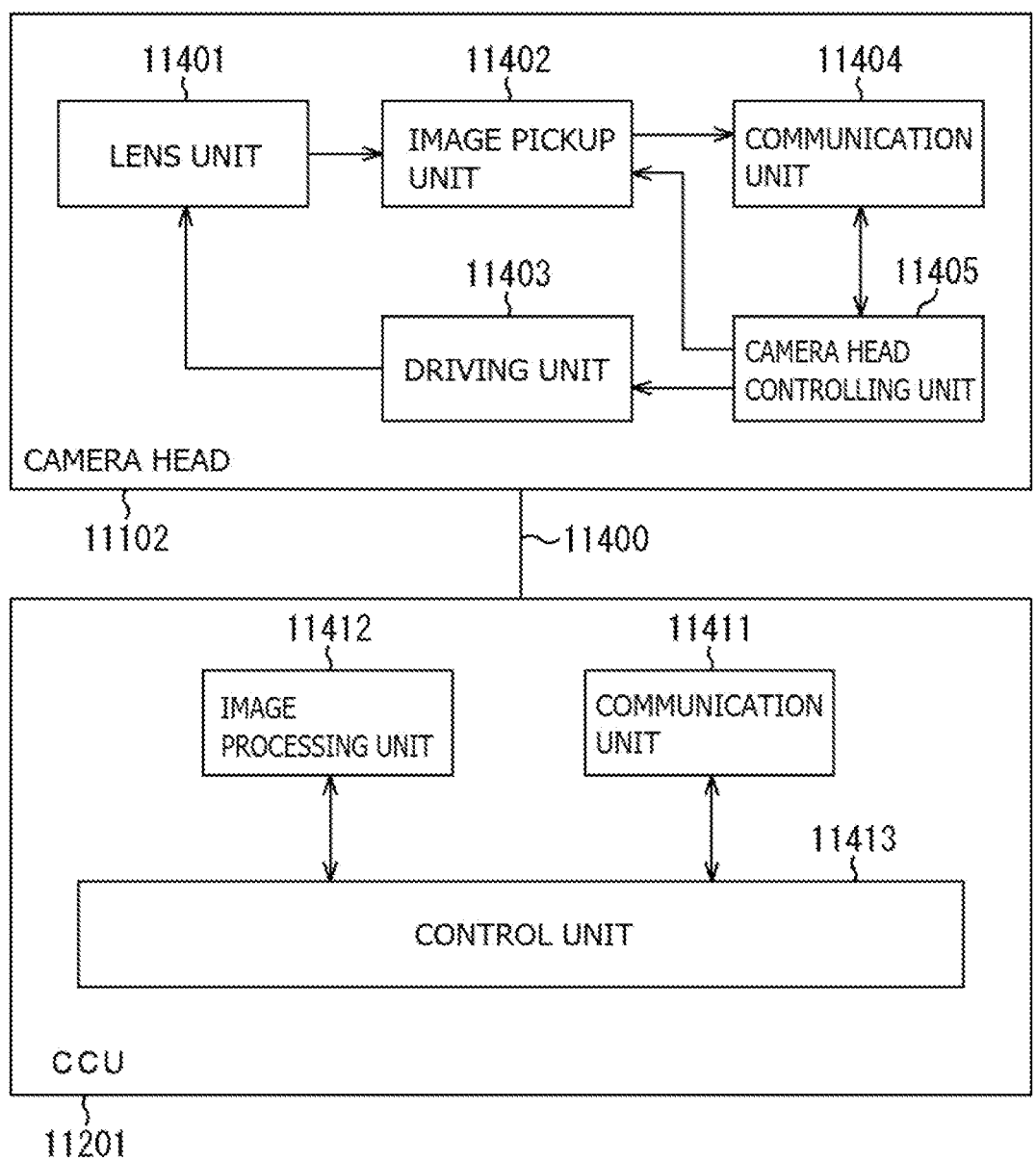
FIG. 43 is a block diagram depicting an example of a functional configuration of a camera head and a camera control unit (CCU).

FIG. 43 is a block diagram depicting an example of a functional configuration of the camera head 11102 and the CCU 11201 depicted in FIG. 42.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The example of the endoscopic surgery system to which the technique according to the present disclosure may be applied has been described. The technique according to the present disclosure may be applied to, among the above-described components, for example, the endoscope 11100, the image pickup section 11402 of the camera head 11102, the image processing section 11412 of the CCU 11201, or the like. Specifically, the solid-state image pickup apparatus 100 or 100E depicted in FIGS. 1 to 3, FIG. 40, or the like can be applied to the image pickup section 10402. By applying the technique according to the present disclosure to the endoscope 11100, the image pickup section 11402 of the camera head 11102, the image processing section 11412 of the CCU 11201, or the like, clearer images of the surgical region can be obtained, enabling the surgeon to reliably check the surgical region. Additionally, by applying the technique according to the present disclosure to the endoscope 11100, the image pickup section 11402 of the camera head 11102, the image processing section 11412 of the CCU 11201, or the like, images of the surgical region can be obtained with lower latency, enabling the surgeon to execute a procedure with a feeling similar to that the surgeon has in the case of directly observing the surgical region.

Note that the endoscopic surgery system has been described as an example but that the technique according to the present disclosure may be applied to, for example, a microscopic surgical system and the like.

<Example of Application to Mobile Body>

The technique according to the present disclosure (present technique) can be applied to various products. For example, the technique according to the present disclosure may be implemented as an apparatus mounted in any type of mobile body such as an automobile, an electric car, a hybrid electric car, a motorcycle, a bicycle, a personal mobility, an airplane, a drone, a ship, and a robot.

Figure 44:
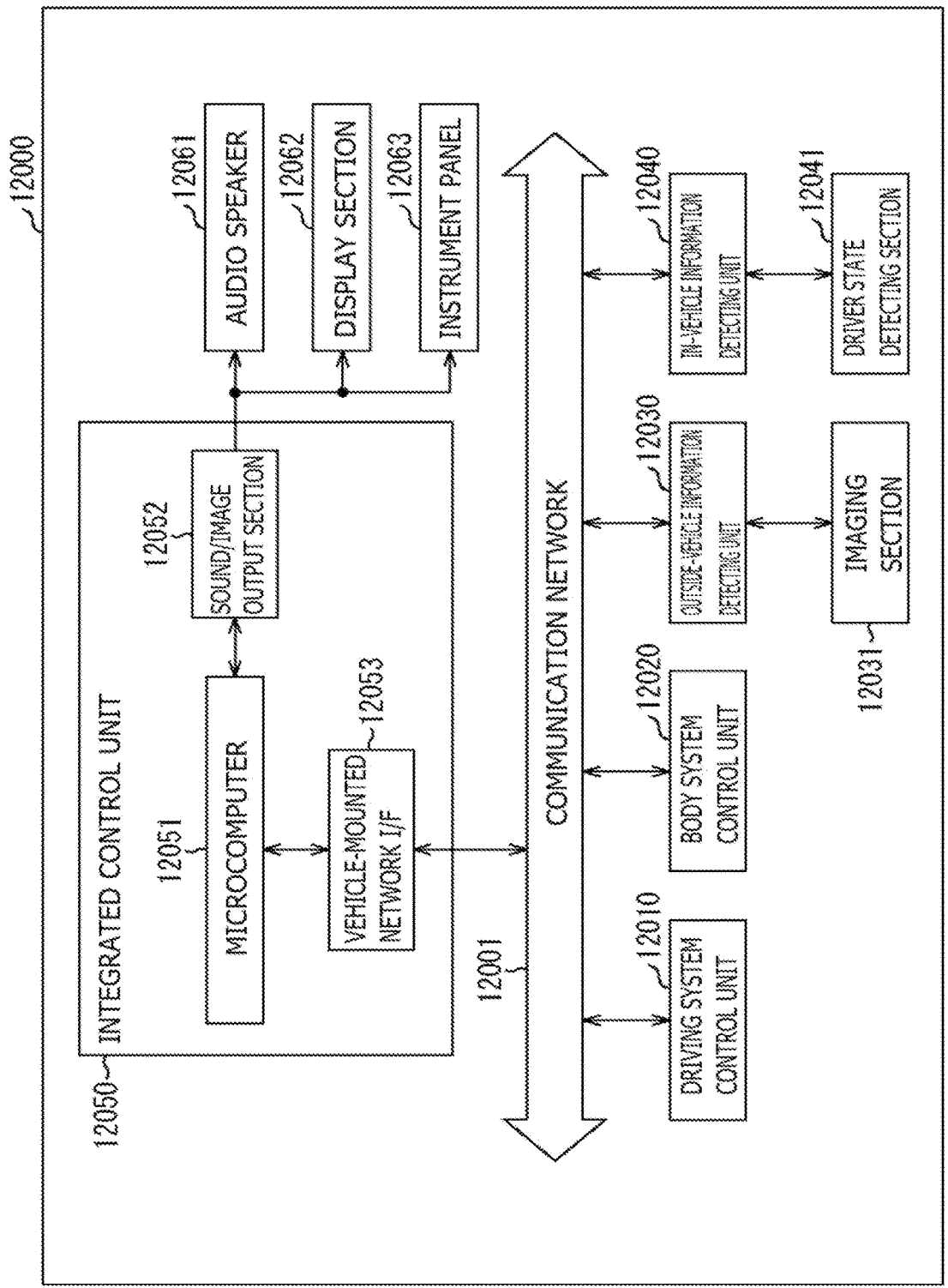
FIG. 44 is a block diagram depicting an example of schematic configuration of a vehicle control system.

FIG. 44 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 44, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 44, an audio speaker 12061, a display section 12062, and an instrument panel 12063 are illustrated as the output device. The display section 12062 may, for example, include at least one of an on-board display and a head-up display.

Figure 45:
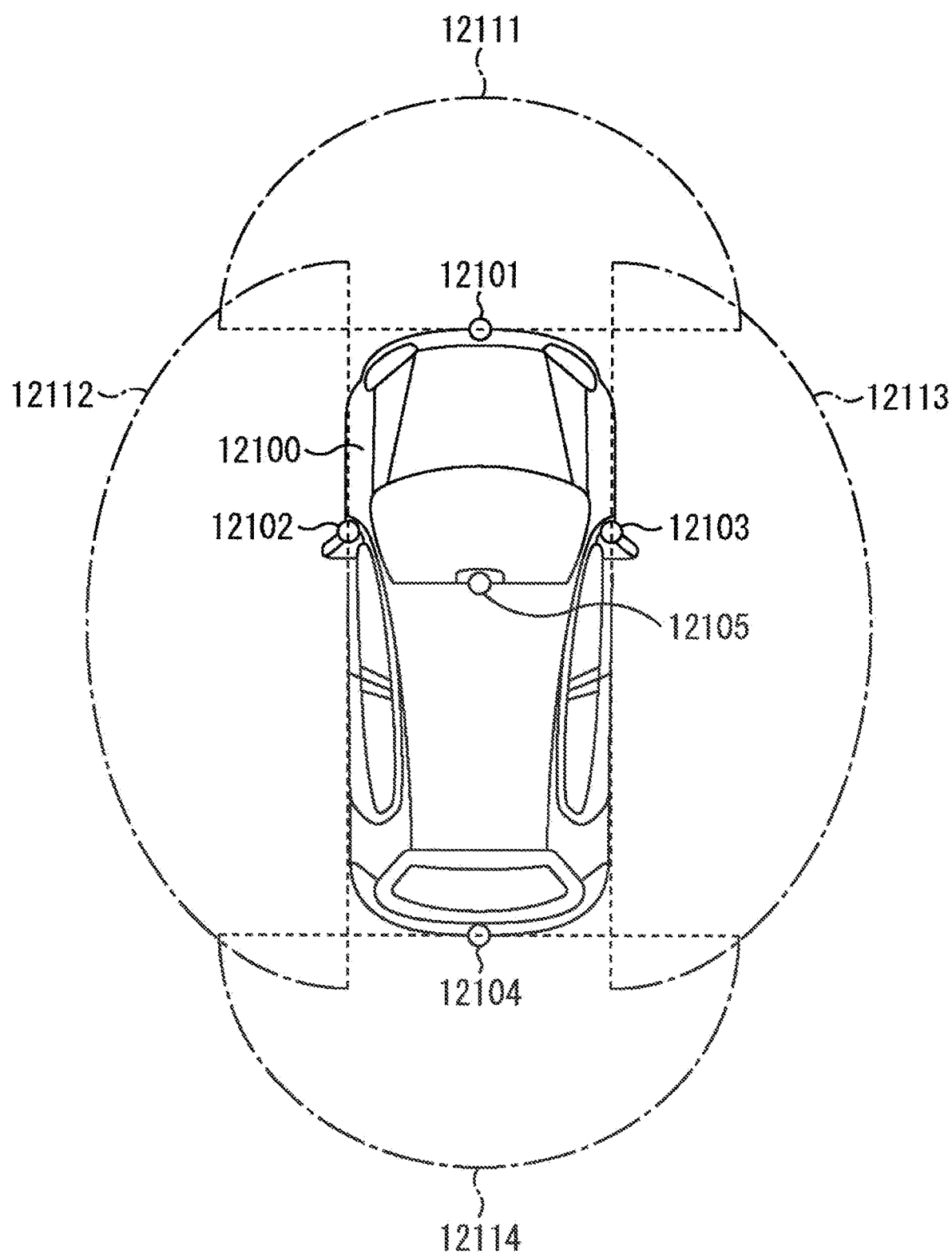
FIG. 45 is a diagram of assistance in explaining an example of installation positions of an outside-vehicle information detecting section and an imaging section.

FIG. 45 is a diagram depicting an example of the installation position of the imaging section 12031.

In FIG. 45, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 45 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technique according to the present disclosure may be applied has been described. The technique according to the present disclosure may be applied to, among the above-described components, the image pickup section 12031 or the like. Specifically, the solid-state image pickup apparatus 100 or 100E depicted in FIGS. 1 to 3, FIG. 40, or the like can be applied to the image pickup section 12031. By applying the technique according to the present disclosure to the image pickup section 12031, easy-to-see images can be picked up, enabling a reduction in the driver's fatigue.

Note that the present disclosure can take the following configurations.

(1) A semiconductor apparatus including:
   a first interconnect section;
   a first interlayer insulating film covering one surface side of the first interconnect section;
   a first electrode section provided in a first through-hole provided in the first interlayer insulating film, the first electrode section being electrically connected to the first interconnect section;
   a second interconnect section;
   a second interlayer insulating film covering a surface side of the second interconnect section facing the first interconnect section; and
   a second electrode section provided in a second through-hole provided in the second interlayer insulating film, the second electrode section being electrically connected to the second interconnect section, in which
   the first electrode section and the second electrode section are directly bonded to each other, and
   the first electrode section has a larger coefficient of thermal expansion than a coefficient of thermal expansion of the first interconnect section.

(2) The semiconductor apparatus according to (1) described above, in which
   the first interconnect section includes a first metal, and
   the first electrode section includes an alloy containing the first metal and a second metal.

(3) The semiconductor apparatus according to (2) described above, further including:
   a first seed layer provided in the first through-hole in contact with the first electrode section, in which
   the first seed layer contains the second metal.

(4) The semiconductor apparatus according to any one of (1) to (3) described above, in which
   the second electrode section has a larger coefficient of thermal expansion than a coefficient of thermal expansion of the second interconnect section.

(5) The semiconductor apparatus according to (4) described above, in which
   the second interconnect section includes a third metal, and
   the second electrode section includes an alloy containing the third metal and a fourth metal.

(6) The semiconductor apparatus according to (5) described above, further including:
   a second seed layer provided in the second through-hole in contact with the second electrode section, in which
   the second seed layer contains the fourth metal.

(7) The semiconductor apparatus according to any one of (1) to (6) described above, further including:
   a first barrier layer provided in the first through-hole and located between the first interconnect section and the first electrode section, the first barrier layer having conductivity.

(8) The semiconductor apparatus according to any one of (1) to (7) described above, further including:
   a second barrier layer provided in the second through-hole and located between the second interconnect section and the second electrode section, the second barrier layer having conductivity.

(9) The semiconductor apparatus according to any one of (1) to (8) described above, in which the first interconnect section includes a first metal,
the first electrode section includes an alloy containing the first metal and a second metal,
the second interconnect section includes a third metal,
the second electrode section includes an alloy containing the third metal and a fourth metal, and
the first metal and the third metal include an identical element.

(10) The semiconductor apparatus according to (9) described above, in which
the second metal and the fourth metal include an identical element.

(11) The semiconductor apparatus according to any one of (1) to (8), further including:
a first substrate; and
a second substrate disposed to face one surface of the first substrate, in which
the first electrode section is provided on one surface side of the first substrate, and
the second electrode section is provided on a surface side of the second substrate facing the first substrate.

(12) Electronic equipment including:
a first interconnect section;
a first interlayer insulating film covering one surface side of the first interconnect section;
a first electrode section provided in a first through-hole provided in the first interlayer insulating film, the first electrode section being electrically connected to the first interconnect section;
a second interconnect section;
a second interlayer insulating film covering a surface side of the second interconnect section facing the first interconnect section; and
a second electrode section provided in a second through-hole provided in the second interlayer insulating film, the second electrode section being electrically connected to the second interconnect section, in which
the first electrode section and the second electrode section are directly bonded to each other, and
the first electrode section has a larger coefficient of thermal expansion than a coefficient of thermal expansion of the first interconnect section.

REFERENCE SIGNS LIST 1, 1A, 1B, 1C, 1D, 1E: Pixel chip
2, 2A, 2B, 2C, 2D, 2E: Logic chip
3, 3A, 3B, 3C, 3D, 3E: Lamination chip
10, 20: Multilayer interconnect
11: First interlayer insulating film
11a, 21a: First insulating film
11b, 21b: Second insulating film
11c, 21c: Third insulating film
11ca, 11ea, 16a, 21ca, 21ea, 26a, 33a: Front surface
11ca: Third insulating film
11d: Fourth insulating film
11e: Fifth insulating film
12, 22: Barrier layer
13, 13A, 23, 23A: Alloy seed layer
13B, 13C, 23B, 23C: Seed layer
14, 24: Segregation layer
14B, 24B: Impurities layer
15, 15a, 15b, 15c, 15d, 25, 25a, 25b, 25c, 25d, 151, 251: Interconnect
16, 16C: First electrode section
21: Second interlayer insulating film
26, 26C: Second electrode section
30: Well region
33, 54: Semiconductor substrate
33b: Back surface
38: Insulating film
39: Light shielding film
40: Bonding surface
71, 72: Light shielding section
72: Light shielding section
81: First dummy electrode
82: Second dummy electrode
91: Interconnect upper portion
92: Interconnect lower portion
100, 100E: Solid-state image pickup apparatus
102: Pixel
103: Pixel region
104: Vertical driving circuit
105: Column signal processing circuit
106: Horizontal driving circuit
107: Output circuit
108: Control circuit
109: Vertical signal line
131, 141, 161: Impurities
201: Image pickup apparatus
202: Optical system
203: Shutter apparatus
204: Solid-state image pickup element
205: Driving circuit
206: Signal processing circuit
207: Monitor
208: Memory
251: Interconnect
10402: Image pickup section
11000: Endoscopic surgery system
11100: Endoscope
11101: Lens barrel
11102: Camera head
11110: Surgical tool
11111: Pneumoperitoneum tube
11112: Energy device
11120: Supporting arm apparatus
11131: Surgeon
11132: Patient
11133: Patient bed
11200: Cart
11202: Display apparatus
11203: Light source apparatus
11204: Input apparatus
11205: Treatment tool controlling apparatus
11206: Pneumoperitoneum apparatus
11207: Recorder
11208: Printer
11400: Transmission cable
11401: Lens unit
11402: Image pickup section
11403: Driving section
11404: Communication section
11405: Camera head controlling section
11411: Communication section
11412: Image processing section
11413: Control section
12000: Vehicle control system
12001: Communication network
12010: Driving system control unit
12020: Body system control unit
12030: Outside-vehicle information detection unit
12031: Image pickup unit
12040: Inside-vehicle information detection unit 12041: Driver state detecting section
12050: Integrated control unit
12051: Microcomputer
12052: Sound/image output section
12061: Audio speaker
12062: Display section
12063: Instrumental panel
12100: Vehicle
12101, 12102, 12103, 12104, 12105: Image pickup section
12111, 12112, 12113, 12114: Image pickup range
FD: Floating diffusion region
H1, H2: Trench via
H1D: Through-hole
H2: Trench via
H11: Trench
H12: Via hole
M1, M2, M3, M4, M5, M11, M12, M13, M14: Metal
PD: Photodiode
Tr1, Tr2: Pixel transistor
Tr11, Tr12, Tr13, Tr14: MOS transistor
Tr_amp: Amplifying transistor
Tr_res: Reset transistor
Tr_sel: Selection transistor
Tr_tra: Transfer transistor

What is claimed is:

1. A semiconductor apparatus, comprising:
a first interconnect section;
a first interlayer insulating film covering and in contact with at least one surface side of the first interconnect section;
a first electrode section provided in a first through-hole provided in the first interlayer insulating film, the first electrode section being electrically connected to the first interconnect section;
a second interconnect section;
a second interlayer insulating film covering and in contact with at least one surface side of the second interconnect section facing the first interconnect section; and
a second electrode section provided in a second through-hole provided in the second interlayer insulating film, the second electrode section being electrically connected to the second interconnect section,
wherein the first electrode section and the second electrode section are directly bonded to each other,
wherein the first interconnect section includes a first metal including Au and the first electrode section includes an alloy containing the first metal including Au, and
wherein the first electrode section has a larger coefficient of thermal expansion than a coefficient of thermal expansion of the first interconnection section and the second electrode section has a larger coefficient of thermal expansion than a coefficient of thermal expansion of the second interconnect section.

2. The semiconductor apparatus according to claim 1, wherein the first electrode section further includes an alloy containing a second metal including Sn or Zn.

3. The semiconductor apparatus according to claim 1, further comprising:
a first seed layer provided in the first through-hole in contact with the first electrode section,
wherein the first seed layer contains the second metal including Sn or Zn.

4. The semiconductor apparatus according to claim 1, wherein
the second interconnect section includes a third metal including Au, and
the second electrode section includes an alloy containing the third metal including Au and a fourth metal including Sn or Zn.

5. The semiconductor apparatus according to claim 4, further comprising:
a second seed layer provided in the second through-hole in contact with the second electrode section,
wherein the second seed layer contains the fourth metal including Sn or Zn.

6. The semiconductor apparatus according to claim 1, further comprising a first barrier layer provided in the first through-hole and located between the first interconnect section and the first electrode section, the first barrier layer having conductivity.

7. The semiconductor apparatus according to claim 1, further comprising a second barrier layer provided in the second through-hole and located between the second interconnect section and the second electrode section, the second barrier layer having conductivity.

8. The semiconductor apparatus according to claim 1, wherein
the first electrode section includes an alloy containing the first metal including Au and a second metal including Sn or Zn,
the second interconnect section includes a third metal including Au,
the second electrode section includes an alloy containing the third metal Au and a fourth metal including Sn or Zn, and
the first metal and the third metal include an identical element.

9. The semiconductor apparatus according to claim 8, wherein the second metal and the fourth metal include an identical element.

10. The semiconductor apparatus according to claim 1, further comprising:
a first substrate; and
a second substrate disposed to face one surface of the first substrate,
wherein the first electrode section is provided on one surface side of the first substrate, and
wherein the second electrode section is provided on a surface side of the second substrate facing the first substrate.

11. Electronic equipment, comprising:
an optical system;
a semiconductor apparatus that receives light from the optical system, the semiconductor apparatus, including:
a first interconnect section;
a first interlayer insulating film covering and in contact with at least one surface side of the first interconnect section;
a first electrode section provided in a first through-hole provided in the first interlayer insulating film, the first electrode section being electrically connected to the first interconnect section;
a second interconnect section;
a second interlayer insulating film covering and in contact with at least one surface side of the second interconnect section facing the first interconnect section; and
a second electrode section provided in a second through-hole provided in the second interlayer insulating film, the second electrode section being electrically connected to the second interconnect section,
wherein the first electrode section and the second electrode section are directly bonded to each other, wherein the first interconnection section includes a first metal including Au and the first electrode section includes an alloy containing the first metal including Au, and wherein the first electrode section has a larger coefficient of thermal expansion than a coefficient of thermal expansion of the first interconnection section and the second electrode section has a larger coefficient of thermal expansion than a coefficient of thermal expansion of the second interconnect section; and a signal processing circuit that processes signals received from the semiconductor apparatus.

12. The electronic equipment according to claim 11, wherein the first electrode section further includes an alloy containing a second metal including Sn or Zn.

13. The electronic equipment according to claim 12, further comprising:
a first seed layer provided in the first through-hole in contact with the first electrode section,
wherein the first seed layer contains the second metal including Sn or Zn.

14. The electronic equipment according to claim 11, wherein
the second interconnect section includes a third metal including Au, and
the second electrode section includes an alloy containing the third metal including Au and a fourth metal including Sn or Zn.

15. The electronic equipment according to claim 14, further comprising:
a second seed layer provided in the second through-hole in contact with the second electrode section,
wherein the second seed layer contains the fourth metal including Sn or Zn.

16. The electronic equipment according to claim 11, further comprising a first barrier layer provided in the first through-hole and located between the first interconnect section and the first electrode section, the first barrier layer having conductivity.

17. The electronic equipment according to claim 11, further comprising a second barrier layer provided in the second through-hole and located between the second interconnect section and the second electrode section, the second barrier layer having conductivity.

18. The electronic equipment according to claim 11, wherein
the first electrode section includes an alloy containing the first metal including Au and a second metal including Sn or Zn,
the second interconnect section includes a third metal including Au,
the second electrode section includes an alloy containing the third metal including Au and a fourth metal including Sn or Zn, and
the first metal and the third metal include an identical element.

19. The electronic equipment according to claim 18, wherein the second metal and the fourth metal include an identical element.

20. The electronic equipment according to claim 11, further comprising:
a first substrate; and
a second substrate disposed to face one surface of the first substrate,
wherein the first electrode section is provided on one surface side of the first substrate, and
wherein the second electrode section is provided on a surface side of the second substrate facing the first substrate.

* * * * *